(12) United States Patent
Kang

(10) Patent No.: US 11,804,265 B2
(45) Date of Patent: Oct. 31, 2023

(54) RESISTIVE MEMORY DEVICE AND METHOD OF OPERATING THE RESISTIVE MEMORY DEVICE

(71) Applicant: SK hynix Inc., Icheon-si (KR)

(72) Inventor: In Ku Kang, Icheon-si (KR)

(73) Assignee: SK hynix Inc., Gyeonggi-do (KR)

( * ) Notice: Subject to any disclaimer, the term of this patent is extended or adjusted under 35 U.S.C. 154(b) by 70 days.

(21) Appl. No.: 17/530,998

(22) Filed: Nov. 19, 2021

(65) Prior Publication Data

US 2022/0415393 A1 Dec. 29, 2022

(30) Foreign Application Priority Data

Jun. 24, 2021 (KR) .................. 10-2021-0081963

(51) Int. Cl.
 *G11C 11/00* (2006.01)
 *G11C 13/00* (2006.01)
(52) U.S. Cl.
 CPC ...... *G11C 13/0069* (2013.01); *G11C 13/0026* (2013.01); *G11C 13/0028* (2013.01); *G11C 13/0038* (2013.01); *G11C 13/0097* (2013.01)
(58) Field of Classification Search
 CPC ............ G11C 13/0069; G11C 13/0026; G11C 13/0028; G11C 13/0038
 USPC ....................................................... 365/148
 See application file for complete search history.

(56) References Cited

U.S. PATENT DOCUMENTS

2013/0301340 A1\* 11/2013 Park ................... G11C 13/0097
 365/148
2015/0009760 A1\* 1/2015 Nam ...................... G11C 16/10
 365/185.18

FOREIGN PATENT DOCUMENTS

| KR | 1020190105174 A | 9/2019 |
| KR | 102010928 B1 | 10/2019 |
| KR | 102040103 B1 | 11/2019 |

\* cited by examiner

*Primary Examiner* — Vu A Le
(74) *Attorney, Agent, or Firm* — WILLIAM PARK & ASSOCIATES LTD.

(57) ABSTRACT

Provided herein may be a resistive memory device and a method of operating the resistive memory device. The resistive memory device may include strings coupled between one or more source lines and one or more bit lines, each string including a set of one or more resistive memory cells, one or more word lines respectively coupled to the set of one or more resistive memory cells; and a voltage generator configured to control a level of a turn-on voltage to be applied to one or more unselected word lines among the one or more word lines depending on a program target state of a subset of resistive memory cells including one or more resistive memory cells selected from among the set of one or more resistive memory cells.

20 Claims, 26 Drawing Sheets

FIG. 11

|  | ERS | PV1 | PV2 | PV3 |  | PVk |
|---|---|---|---|---|---|---|
| Sel_BL | GND | Vset | Vset | Vset |  | Vset |
| Unsel_BL | – | GND | GND | GND |  | GND |
| Sel_DSL | eVon | 1Von | 2Von | 3Von |  | kVon |
| Unsel_DSL | Voff | Voff | Voff | Voff |  | Voff |
| Sel_WL | Voff | Voff | Voff | Voff |  | Voff |
| Unsel_WL | eVon | 1Von | 2Von | 3Von | ... | kVon |
| SL | Vreset | GND | GND | GND |  | GND |

FIG. 13

|           | ERS  | PV1     | PV2     | PV3     |     | PVk     |
|-----------|------|---------|---------|---------|-----|---------|
| BL        | Vset | GND     | GND     | GND     |     | GND     |
| Sel_DSL   | Von  | Von     | Von     | Von     |     | Von     |
| Unsel_DSL | Voff | Voff    | Voff    | Voff    |     | Voff    |
| Sel_WL    | Voff | Voff    | Voff    | Voff    |     | Voff    |
| Unsel_WL  | Von  | Von     | Von     | Von     | ... | Von     |
| SL        | GND  | 1Vreset | 2Vreset | 3Vreset |     | kVreset |

FIG. 15

|          | ERS    | PV1   | PV2   | PV3   |     | PVk   |
|----------|--------|-------|-------|-------|-----|-------|
| Sel_BL   | GND    | Vset  | Vset  | Vset  |     | Vset  |
| Unsel_BL | –      | GND   | GND   | GND   |     | GND   |
| Sel_DSL  | eVon   | kVon  | kVon  | kVon  |     | kVon  |
| Unsel_DSL| Voff   | Voff  | Voff  | Voff  |     | Voff  |
| Sel_WL   | Voff   | Voff  | Voff  | Voff  |     | Voff  |
| Unsel_WL | eVon   | kVon  | kVon  | kVon  | ... | kVon  |
| Sel_SSL  | eVon   | 1Von  | 2Von  | 3Von  |     | kVon  |
| Unsel_SSL| eVoff  | Voff  | Voff  | Voff  |     | Voff  |
| SL       | Vreset | GND   | GND   | GND   |     | GND   |

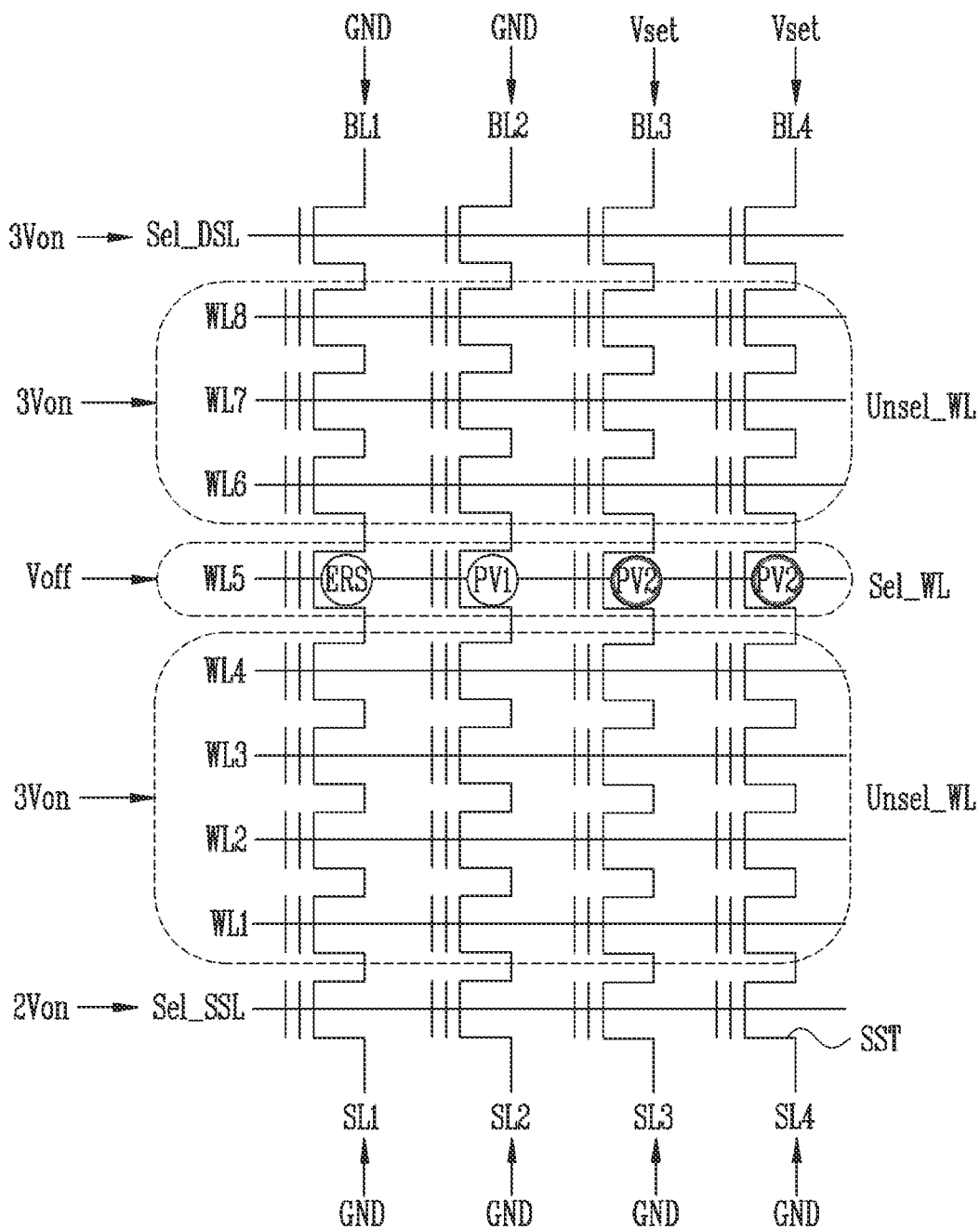

RESISTIVE MEMORY DEVICE AND METHOD OF OPERATING THE RESISTIVE MEMORY DEVICE

CROSS-REFERENCE TO RELATED APPLICATION

The present application claims priority under 35 U.S.C. § 119(a) to Korean patent application number 10-2021-0081963, filed on Jun. 24, 2021, in the Korean Intellectual Property Office, the entire disclosure of which is incorporated herein by reference.

BACKGROUND

1. Technical Field

Various embodiments of the present disclosure relate to a resistive memory device and a method of operating the resistive memory device, and more particularly to a resistive memory device and a method of programming the resistive memory device.

2. Related Art

Memory devices may be classified into a volatile memory device in which stored data is lost when the supply of power is interrupted and a nonvolatile memory device in which stored data is retained even when the supply of power is interrupted.

Examples of the nonvolatile memory device may include a NAND flash memory, a NOR flash memory, a resistive memory (or a resistive random access memory: ReRAM), a phase-change random access memory (PRAM), a magnetoresistive random access memory (MRAM), a ferroelectric random access memory (FRAM), a spin transfer torque random access memory (STT-RAM), etc.

Among the examples, the resistive memory (ReRAM) may include a data storage layer which can store data, and electrodes in contact with both ends of the data storage layer. The data storage layer may be programmed or erased through resistance varying with a voltage that is applied to the electrodes. For example, a unipolar or bipolar resistive memory material may be used as the data storage layer.

SUMMARY

An embodiment of the present disclosure may provide for a resistive memory device. The resistive memory device may include one or more strings respectively coupled between one or more source lines and one or more bit lines, each string including a set of one or more resistive memory cells, one or more word lines respectively coupled to the set of one or more resistive memory cells, and a voltage generator configured to control a level of a turn-on voltage to be applied to one or more unselected word lines among the one or more word lines depending on a program target state of a subset of resistive memory cells including one or more resistive memory cells selected from among the set of one or more resistive memory cells.

An embodiment of the present disclosure may provide for a method of operating a resistive memory device during a program operation performed on resistive memory cells coupled between one or more source lines and one or more bit lines. The method may include applying a ground voltage to the one or more source lines and applying a set voltage higher than the ground voltage to one or more bit lines selected from among the one or more bit lines, applying a turn-off voltage to a selected word line coupled to resistive memory cells selected from among the resistive memory cells, and applying a turn-on voltage, a level of which is controlled depending on a program target state of the selected resistive memory cells, to unselected word lines coupled to unselected resistive memory cells among the resistive memory cells.

An embodiment of the present disclosure may provide for a method of operating a resistive memory device. The method may include applying a ground voltage to selected bit lines and applying reset voltages to selected source lines, applying a turn-off voltage to a selected word line, and applying a turn-on voltage to unselected word lines, wherein the reset voltages may be controlled depending on a program target state of selected memory cells coupled to the selected word line.

BRIEF DESCRIPTION OF THE DRAWINGS

FIG. 11 is a diagram illustrating a program operation according to a first embodiment of the present disclosure.

FIG. 13 is a diagram illustrating a program operation according to a second embodiment of the present disclosure.

FIG. 15 is a diagram illustrating a program operation according to a third embodiment of the present disclosure.

FIGS. 16A, 16B, 16C, and 16D are diagrams illustrating steps of the program operation according to the third embodiment.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Some embodiments of the present disclosure are directed to a resistive memory device, which can store a plurality of bits in one memory cell, and a method of operating the resistive memory device.

Figure 1:
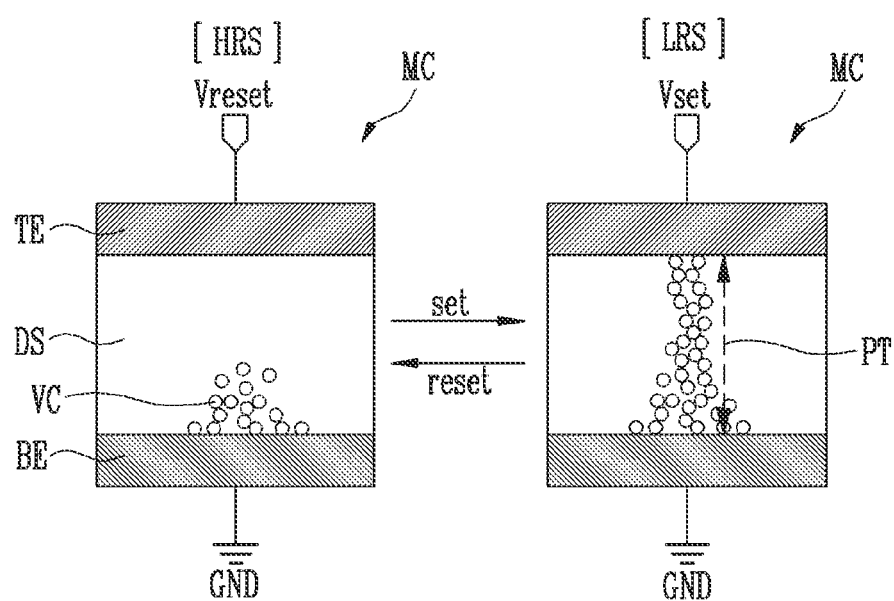
FIG. 1 illustrates a principle based on which data is stored in a resistive memory device.

FIG. 1 illustrates a principle based on which data is stored in a resistive memory device.

Referring to FIG. 1, a memory cell MC included in the resistive memory device may include a bottom electrode BE, a top electrode TE, and a data storage layer DS. The bottom electrode BE and the top electrode TE may each be made of a conductive material, and the data storage layer DS may be made of a variable resistance material.

Each of the bottom electrode BE and the top electrode TE may be made of any one material, or two or more materials selected from among aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), Tin (Sn), zirconium (Zr), zinc (Zn), iridium oxide ($IrO_2$), and strontium zirconate (StZrO3).

The data storage layer DS may be made of a bipolar resistive memory material or a unipolar resistive memory material. The bipolar resistive memory material may be in a set or reset state depending on different voltages applied to the bottom electrode BE and the top electrode TE. Perovskite-based materials may be used as the bipolar resistive memory material. The unipolar resistive memory material may be programmed to a set or reset state even by a voltage pulse having the same polarity. As the unipolar resistive memory material, transition metal oxide such as nickel oxide ($NiO_x$) or titanium oxide ($TiO_x$) may be used.

In the data storage layer DS, spaces in which atoms are missing are present, which are called vacancies (VC). Because vacancies VC have polarity, the vacancies may migrate depending on the voltages applied to the top electrode TE and the bottom electrode BE. For example, when a reset voltage Vreset is applied to the top electrode TE and a ground voltage GND is applied to the bottom electrode BE, the vacancies VC may migrate towards the bottom electrode BE. In this case, a current path PT through which electrons can move between the top electrode TE and the bottom electrode BE is blocked, and thus resistance may increase. This state is referred to as a "high resistance state: HRS". The current path PT may also be referred to as a "filament".

When a set voltage Vset is applied to the top electrode TE and the ground voltage GND is applied to the bottom electrode BE, some of vacancies concentrated on the bottom electrode BE may migrate towards the top electrode TE, thus enabling the current path PT, through which electrons can move, to be formed between the bottom electrode BE and the top electrode TE. This state is referred to as a "low resistance state: LRS".

That is, in the high-resistance state HRS, the current of the data storage layer DS may decrease due to an increase in the resistance of the data storage layer DS, whereas, in the low-resistance state LRS, the current of the data storage layer DS may increase due to a decrease in the resistance of the data storage layer DS. The memory cell MC may be programmed to the set or reset state or erased depending on the resistance state.

Since voltages that can be applied to the top electrode TE and the bottom electrode BE are not limited by the embodiment of FIG. 1, voltages having various levels may be used.

Figure 2:
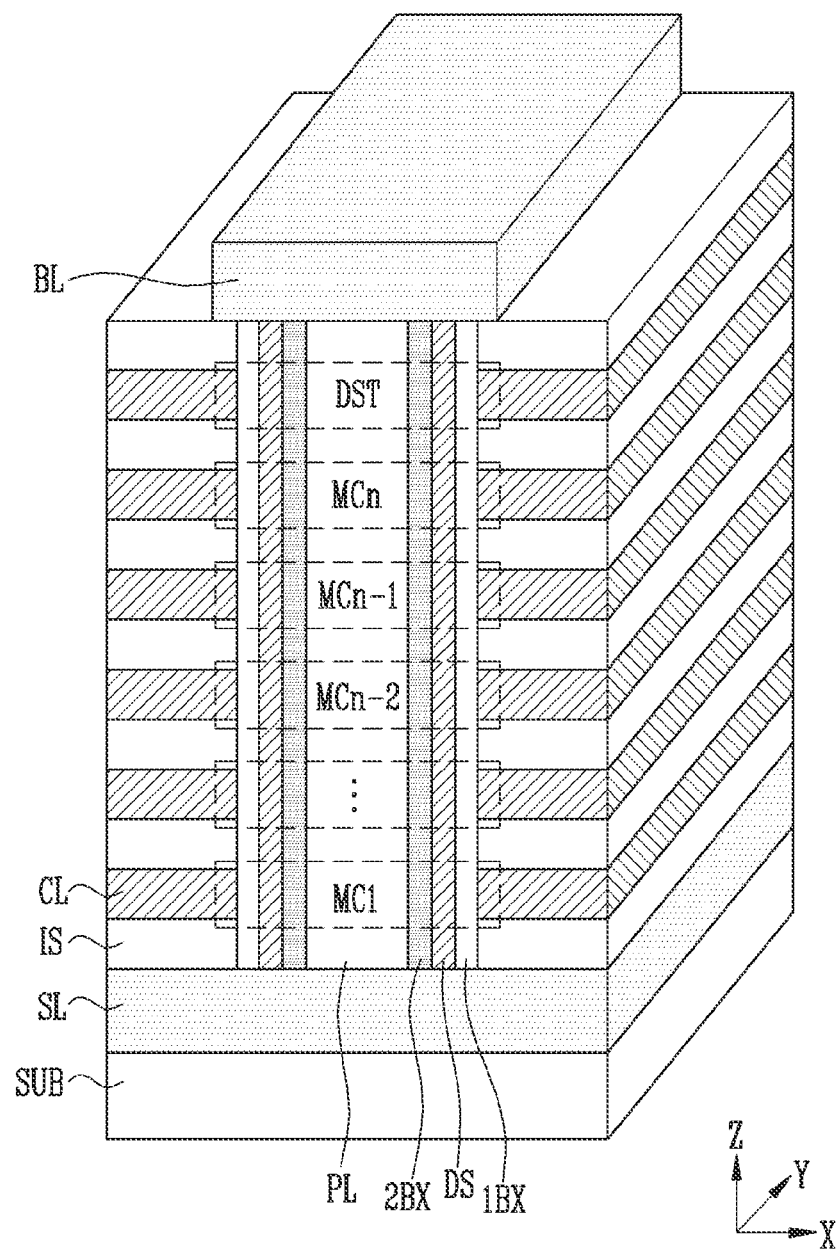
FIG. 2 is a perspective view illustrating a resistive memory device according to the present disclosure.

FIG. 2 is a perspective view illustrating a resistive memory device according to the present disclosure.

Referring to FIG. 2, the resistive memory device may include memory blocks, each including a plurality of memory cells, and a portion of a memory block is illustrated in FIG. 2.

The memory block may include first to n-th memory cells MC1 to MCn stacked vertically on a substrate SUB. When the substrate SUB is formed along an X-Y plane, the memory block may be formed in a Z direction perpendicular to the X-Y plane. For example, a source line SL and a bit line BL may be stacked on the top of the substrate SUB, and interlayer insulating layers IS and conductive layers CL may be alternately stacked between the source line SL and the bit line BL. For example, the interlayer insulating layers IS may be made of oxide, and the conductive layers CL may be made of tungsten. Some of the conductive layers CL may be used as word lines, and some of the conductive layers may be used as selection lines (or select lines).

Each of the memory cells may include a first blocking layer 1BX, a data storage layer DS, and a second blocking layer 2BX, which pass through the interlayer insulating layers IS and the conductive layers CL in a vertical direction (i.e., a Z direction). For example, the first blocking layer 1BX may be formed in the shape of a cylinder passing through the interlayer insulating layers IS and the conductive layers CL in a vertical direction (i.e., Z direction), the data storage layer DS may be formed in the shape of a cylinder along the inner wall of the first blocking layer 1BX, and the second blocking layer 2BX may be formed in the shape of a cylinder along the inner wall of the data storage layer DS. In a hollow space within the second blocking layer 2BX, a plug PL having a cylindrical shape may be formed. Each of the first blocking layer 1BX, the second blocking layer 2BX, and the plug PL may be made of oxide, and the data storage layer DS may be made of a bipolar resistive memory material or a unipolar resistive memory material.

Among the first blocking layer 1BX, the data storage layer DS, and the second blocking layer 2BX which are formed in the vertical direction (e.g., Z direction), layers formed on a layer on which the conductive layers CL are formed may be used as memory cells or select transistors. For example, the first to n-th memory cells MC1 to MCn may be sequentially formed on the top of the source line SL, and a drain select transistor DST may be formed on the top of the n-th memory cell MCn.

Figure 3:
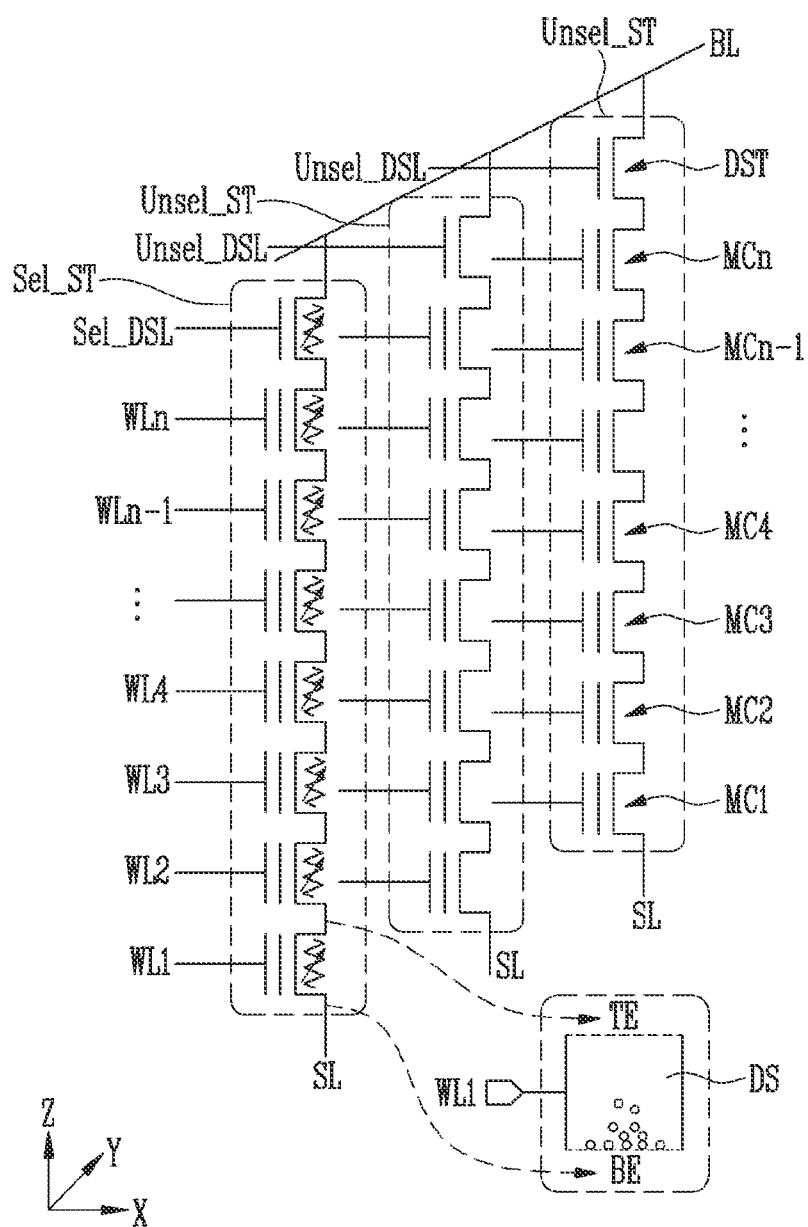
FIG. 3 is a circuit diagram illustrating a resistive memory device according to the present disclosure.

FIG. 3 is a circuit diagram illustrating a resistive memory device according to the present disclosure.

Referring to FIG. 3, first to n-th memory cells and a drain select transistor DST may form a single string, and a plurality of strings may be coupled between a bit line BL and a source line SL. Therefore, since a plurality of bit lines BL are coupled to one memory block, a plurality of strings may be included in one memory block. A selected string Sel_ST in a program operation or a read operation may be determined based on a voltage applied to a selected drain select line Sel_DSL among drain select lines DSL. For example, when a ground voltage is applied to unselected drain select lines Unsel_DSL and a turn-on voltage is applied to the selected drain select line Sel_DSL, strings ST coupled to the selected drain select line Sel_DSL may be selected. In an embodiment, strings ST coupled to the unselected drain select line Unsel_DSL may be unselected strings Unsel_ST. In other words, during the program operation or the read operation, the strings ST coupled to the selected drain select line Sel_DSL, among the plurality of strings coupled to the plurality of bit lines BL, may be the targets of the program operation or the read operation.

When the first to n-th memory cells MC1 to MCn and the drain select transistor DST included in the selected string Sel_ST are implemented as resistive memory elements, a top node of each of the memory cells or the select transistors may be a top electrode TE, and a bottom node thereof may be a bottom electrode BE. When the first memory cell MC1 is described by way of example, a node between the first and second memory cells MC1 and MC2 may be the top electrode TE, and the source line SL may be the bottom electrode BE. Therefore, the first memory cell MC1 may be set or reset depending on the voltage applied to a channel between the first and second memory cells MC1 and MC2, and the voltage applied to the source line SL.

Figure 4:
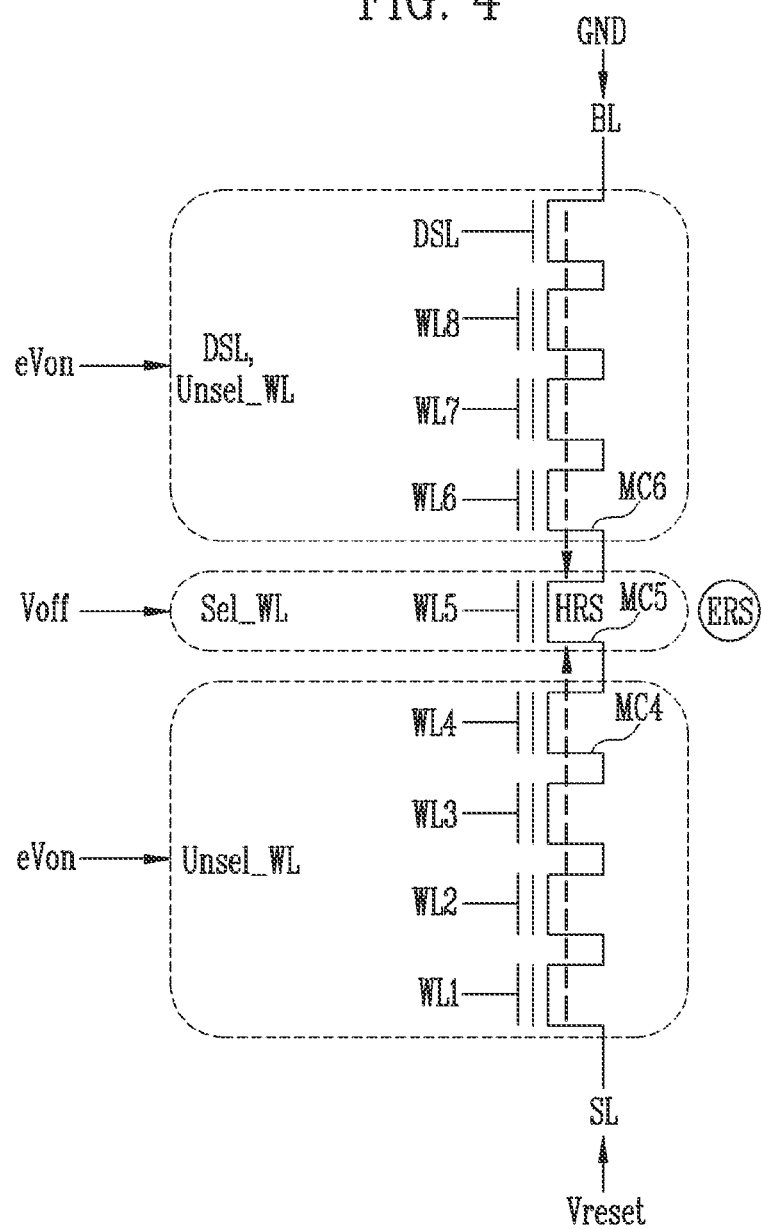
FIG. 4 is a diagram illustrating a method of erasing a selected memory cell.

FIG. 4 is a diagram illustrating a method of erasing a selected memory cell.

Referring to FIG. 4, a structure in which eight memory cells and one drain select transistor are coupled to one string is illustrated by way of example. First to eight word lines WL1 to WL8 may be coupled to the memory cells, and a drain select line DSL may be coupled to a drain select transistor. Assuming that the fifth word line WL5 is a selected word line Sel_WL, the fifth memory cell MC5 coupled to the fifth word line WL5 is a memory cell selected for an erase operation.

A reset voltage Vreset may be applied to a source line SL, and a ground voltage GND may be applied to a bit line BL. A turn-off voltage Voff may be applied to the selected word line Sel_WL, and an erase turn-on voltage eVon may be applied to unselected word lines Unsel_WL, other than the selected word line Sel_WL, and to the drain select line DSL.

The reset voltage Vreset may be set to a negative voltage lower than the ground voltage GND. The turn-off voltage Voff may be set to the ground voltage GND, and the erase turn-on voltage eVon may be set to a positive voltage higher than the turn-off voltage Voff. The erase turn-on voltage eVon may be set to transfer the reset voltage Vreset applied to the source line SL up to the fifth memory cell MC5, and to transfer the ground voltage GND applied to the bit line BL up to the fifth memory cell MC5. A principle based on which the fifth memory cell MC5 coupled to the selected word line Sel_WL enters an erased state ERS is described below.

When the erase turn-on voltage eVon is applied to gates of the fourth and sixth memory cells MC4 and MC6, which are unselected memory cells, vacancies in the fourth and sixth memory cells MC4 and MC6 may migrate towards word lines to form a current path. In other words, with respect to the fifth memory cell MC5, the fourth memory cell MC4 may be a bottom electrode, and the sixth memory cell MC6 may be a top electrode.

Because the reset voltage Vreset is applied to the fourth memory cell MC4 and the ground voltage GND is applied to the sixth memory cell MC6, the reset voltage Vreset is applied to the bottom electrode of the fifth memory cell MC5 and the ground voltage GND is applied to the top electrode of the fifth memory cell MC5. Therefore, vacancies in the fifth memory cell MC5 may migrate towards the sixth memory cell MC6 far from the fourth memory cell MC4, and thus the fifth memory cell MC5 may enter a high resistance state HRS. In the present embodiment, the high resistance state HRS may be defined as an erased state ERS.

Figure 5:
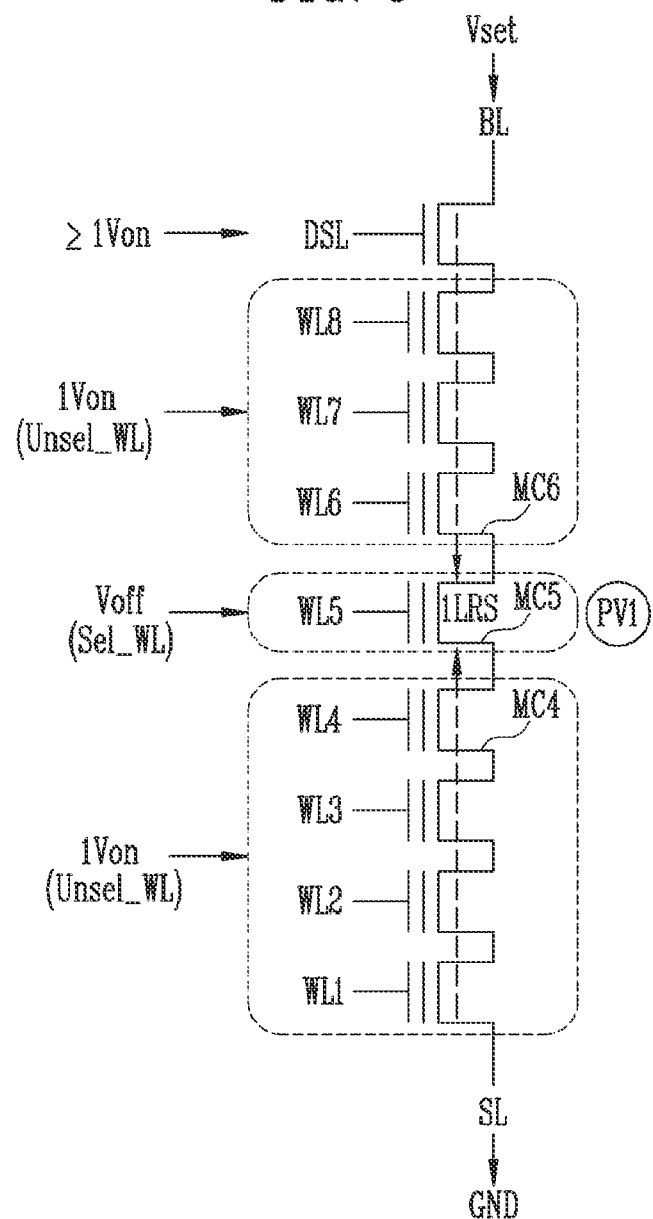
FIG. 5 is a diagram illustrating a method of programming a selected memory cell to a first target state.

FIG. 5 is a diagram illustrating a method of programming a selected memory cell to a first target state.

Referring to FIG. 5, assuming that a fifth word line WL5 is a selected word line Sel_WL, a fifth memory cell MC5 coupled to the fifth word line WL5 is the selected memory cell to be programmed to a first program state PV1.

A ground voltage GND may be applied to a source line SL, and a set voltage Vset may be applied to a bit line BL. A turn-off voltage Voff may be applied to the selected word line Sel_WL, a first turn-on voltage 1Von may be applied to unselected word lines Unsel_WL, other than the selected word line Sel_WL, and the first turn-on voltage 1Von or a voltage higher than the first turn-on voltage 1Von may be applied to a drain select line DSL.

The set voltage Vset may be set to a positive voltage higher than the ground voltage GND, and the turn-off voltage Voff may be set to the ground voltage GND. The first turn-on voltage 1Von may be set to a positive voltage higher than the turn-off voltage Voff. The first turn-on voltage 1Von may set to transfer the ground voltage GND applied to the source line SL up to the fifth memory cell MC5, and to transfer the set voltage Vset applied to the bit line BL up to the fifth memory cell MC5. A principle based on which the fifth memory cell MC5 coupled to the selected word line Sel_WL is programmed to the first program state PV1 is described below.

When the first turn-on voltage 1Von is applied to gates of the fourth and sixth memory cells MC4 and MC6, which are unselected memory cells, a current path may be formed while vacancies in the fourth and sixth memory cells MC4 and MC6 are migrating towards the word lines. That is, with respect to the fifth memory cell MC5, the fourth memory cell MC4 may be a bottom electrode, and the sixth memory cell MC6 may be a top electrode.

Because the ground voltage GND is applied to the fourth memory cell MC4 and the set voltage Vset is applied to the sixth memory cell MC6, the ground voltage GND is applied to the bottom electrode of the fifth memory cell MC5 and the set voltage Vset is applied to the top electrode of the fifth memory cell MC5. Therefore, vacancies in the fifth memory cell MC5 may be coupled between the fourth memory cell MC4 and the sixth memory cell MC6, and thus the fifth memory cell MC5 may enter a first low resistance state 1LRS. That is, because a current path is formed by the first turn-on voltage 1Von, and the amount of current can be determined depending on the current path, the set voltage Vset transferred to the sixth memory cell MC6 may have a level lower than that of the set voltage Vset applied to the bit line BL. Therefore, the resistance of the fifth memory cell MC5 may be programmed to the first low resistance state 1LRS depending on the level of the set voltage Vset transferred through the sixth memory cell MC6. In the present embodiment, the first low resistance state 1LRS is defined as the first program state PV1.

Figure 6:
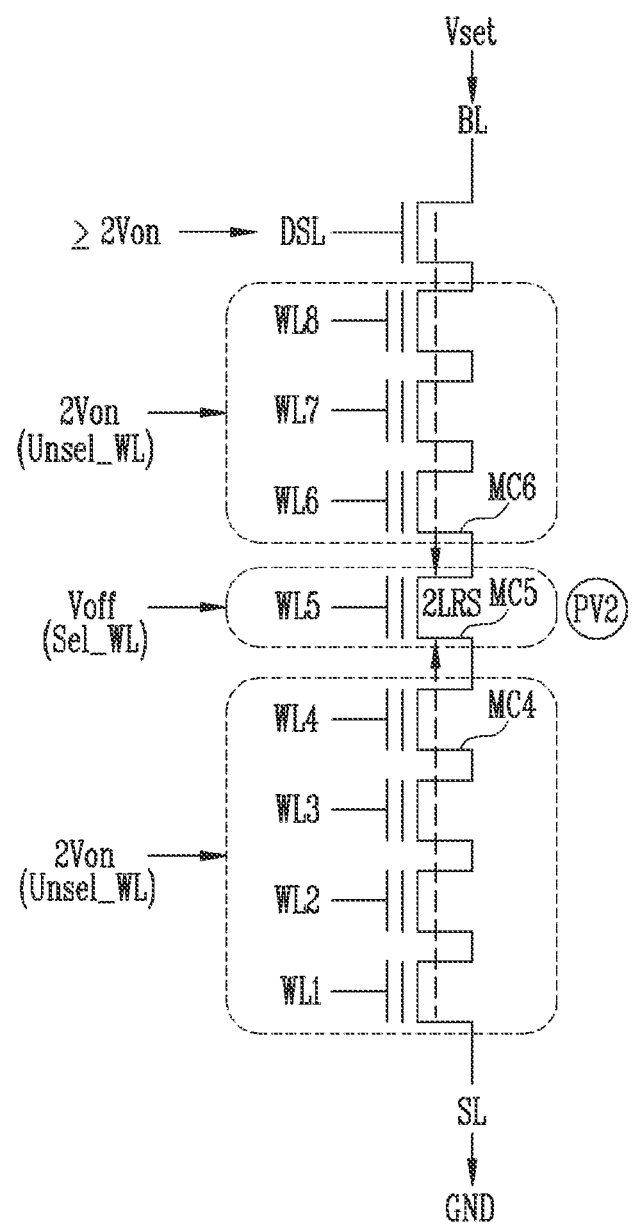
FIG. 6 is a diagram illustrating a method of programming a selected memory cell to a second target state.

FIG. 6 is a diagram illustrating a method of programming a selected memory cell to a second target state.

Referring to FIG. 6, assuming that a fifth word line WL5 is a selected word line Sel_WL, a fifth memory cell MC5 coupled to the fifth word line WL5 is the selected memory cell to be programmed to a second program state PV2.

A ground voltage GND may be applied to a source line SL, and a set voltage Vset may be applied to a bit line BL. A turn-off voltage Voff may be applied to the selected word line Sel_WL, a second turn-on voltage 2Von may be applied to unselected word lines Unsel_WL, other than the selected word line Sel_WL, and the second turn-on voltage 2Von or a voltage higher than the second turn-on voltage 2Von may be applied to a drain select line DSL.

The set voltage Vset may be set to a positive voltage higher than the ground voltage GND, and the turn-off voltage Voff may be set to the ground voltage GND. The second turn-on voltage 2Von may be set to a positive voltage higher than a first turn-on voltage (i.e., 1Von of FIG. 5). The second turn-on voltage 2Von may set to transfer the ground voltage GND applied to the source line SL up to the fifth memory cell MC5, and to transfer the set voltage Vset applied to the bit line BL up to the fifth memory cell MC5. A principle based on which the state of the fifth memory cell MC5 coupled to the selected word line Sel_WL is programmed to a second program state PV2 higher than the first program state PV1 is described below.

When the second turn-on voltage 2Von is applied to gates of the fourth and sixth memory cells MC4 and MC6, which are unselected memory cells, a current path may be formed while vacancies in the fourth and sixth memory cells MC4 and MC6 are migrating towards the word lines. That is, with respect to the fifth memory cell MC5, the fourth memory cell MC4 may be a bottom electrode, and the sixth memory cell MC6 may be a top electrode.

Because the ground voltage GND is applied to the fourth memory cell MC4 and the set voltage Vset is applied to the sixth memory cell MC6, the ground voltage GND is applied to the bottom electrode of the fifth memory cell MC5, and the set voltage Vset is applied to the top electrode of the fifth memory cell MC5. Therefore, vacancies in the fifth memory cell MC5 may be coupled between the fourth memory cell MC4 and the sixth memory cell MC6, and thus the fifth memory cell MC5 may enter a second low resistance state 2LRS. Since a current path is formed by the second turn-on voltage higher than the first turn-on voltage 1Von, the set voltage Vset transferred to the sixth memory cell MC6 may have a level higher than that of the set voltage Vset transferred by the first turn-on voltage Vset. Therefore, the resistance of the fifth memory cell MC5 may be programmed to the second low resistance state 2LRS lower than the first low resistance state 1LRS depending on the level of the set voltage Vset transferred through the sixth memory cell MC6. In the present embodiment, the second low resistance state 2LRS is defined as the second program state PV2.

As described above, the resistance of the selected memory cell may be controlled by adjusting the level of the turn-on voltage applied to the unselected word lines Unsel_WL. Because current flowing through the selected memory cell is determined depending on the resistance of the selected memory cell, memory cells may be programmed to various states.

Figure 7:
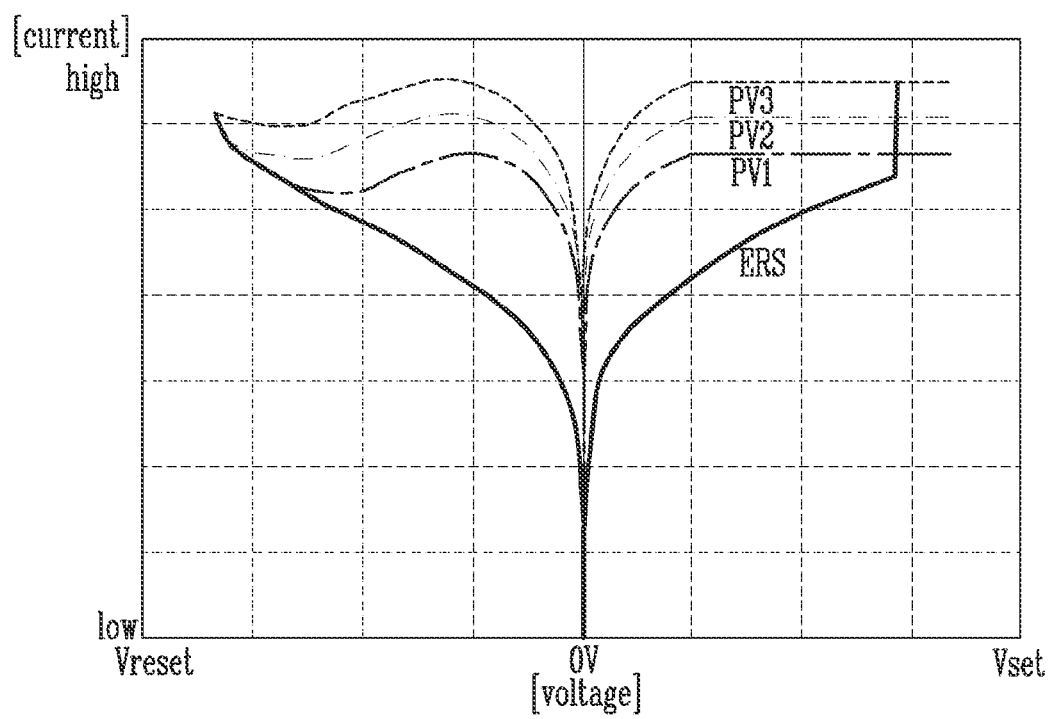
FIG. 7 is a diagram illustrating the states of memory cells depending on current.

FIG. 7 is a diagram illustrating the states of memory cells depending on current.

Referring to FIG. 7, selected memory cells may be programmed or erased to have various resistance values. For example, when a set voltage Vset is applied to the top electrode of memory cells, the memory cells may be programmed to any one of first to third program states PV1 to PV3 while the current of the memory cells increases. Then, when a reset voltage Vreset is applied to the top electrode, the memory cells may be erased to enter an erased state ERS while current decreases, whereas when the reset voltage Vreset lower than a previous voltage is applied to the top electrode, the memory cells may be programmed to any one of the first to third program states PV1 to PV3 while current of the memory cells increases again.

In the above description, although it is described that the states of memory cells are changed depending on the voltage of the top electrode, the states of memory cells may also be changed depending on the voltage of the bottom electrode.

Figure 8:
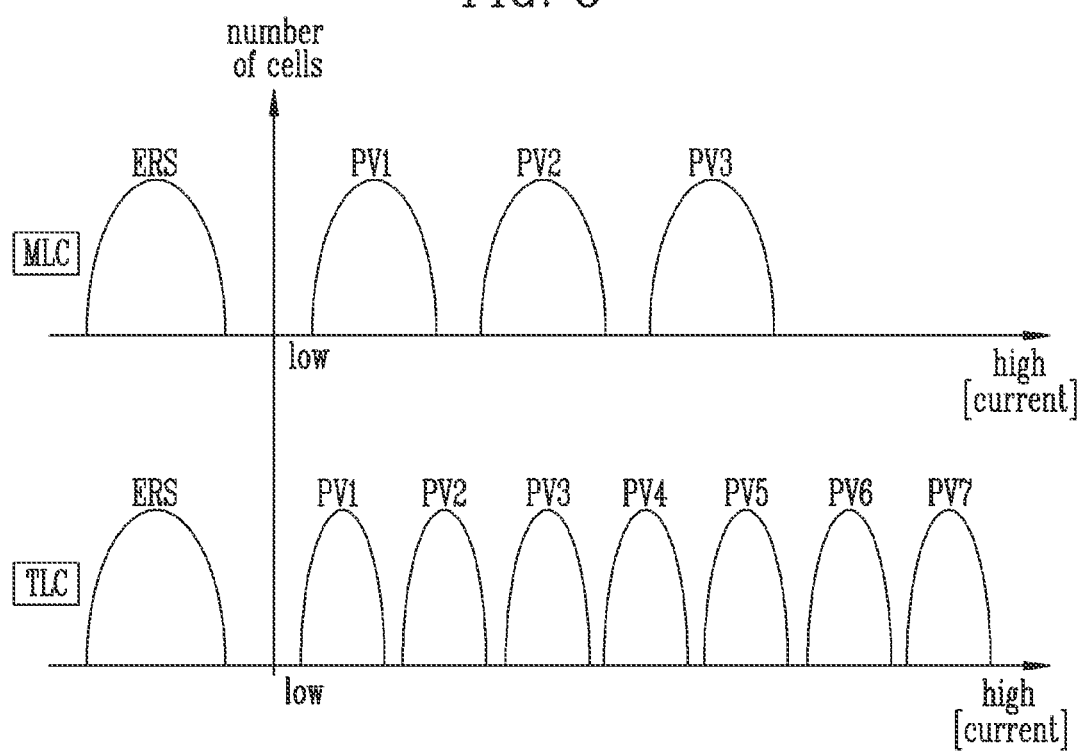
FIG. 8 is a diagram illustrating threshold voltage distributions depending on program schemes.

FIG. 8 is a diagram illustrating threshold voltage distributions depending on program schemes.

Referring to FIG. 8, as in the case of the above-described embodiment, a scheme for programming selected memory cells to an erased state ERS and first to third program states PV1 to PV3 may be regarded as a multi-level cell (MLC) scheme. In the multi-level cell (MLC) scheme, one memory cell may store two bits of data. Each selected memory cell may be erased to a single high resistance state or may be programmed to any one of three low resistance states. As a threshold voltage distribution becomes higher, resistance becomes lower, and then the amount of current flowing through the selected memory cells may increase.

The present embodiment may be applied to a triple-level cell (TLC) scheme in which three bits of data are stored in one memory cell in addition to the multi-level cell (MLC) scheme, and may also be applied to schemes above the triple-level cell (TLC) scheme.

Figure 9:
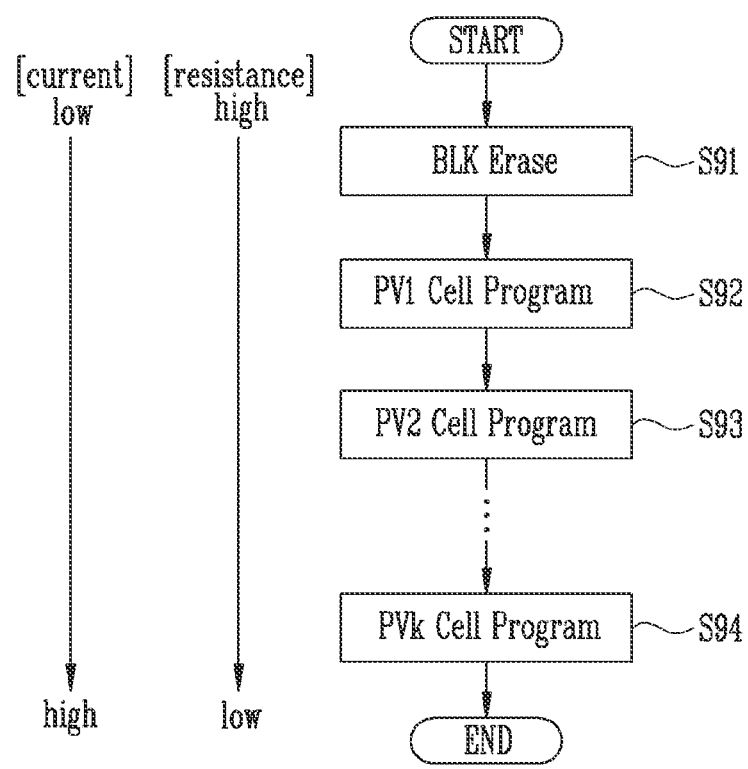
FIG. 9 is a flowchart illustrating a program operation according to the present disclosure.

FIG. 9 is a flowchart illustrating a program operation according to the present disclosure.

Referring to FIG. 9, a program operation on selected memory cells may be performed such that, after an erase operation has been performed on the selected memory cells, the selected memory cells are programmed in ascending order of a threshold voltage distribution. In other words, the program operation may be performed in order from the high level to the low level of the resistance of the selected memory cells, or in order from the low level to the high level of the current of the selected memory cells.

For example, before a program operation is performed on the selected memory cells, an erase operation may be performed on the selected memory cells at step S91. When the erase operation is terminated, a first program operation may be performed on memory cells to be programmed to a first program state PV1, which has the lowest level, or higher program states among program states, at step S92. The first program operation may be performed by applying a turn-off voltage to a selected word line and applying a first turn-on voltage 1Von to unselected word lines. During a verify operation performed in the first program operation, whether the amount of current generated by the selected memory cells is a first current amount may be determined. When the amount of current generated by the selected memory cells is the first current amount, a second program operation may be performed on memory cells to be programmed to a second program state PV2 or higher program states at step S93. During the second program operation, a second turn-on voltage 2Von higher than the first turn-on voltage 1Von may be applied to unselected word lines. When a program operation performed on the selected memory cells up to a k-th program state PVk having the highest threshold voltage is terminated through the above-described scheme at step S94, the program operation on the selected memory cells may be terminated.

Figure 10:
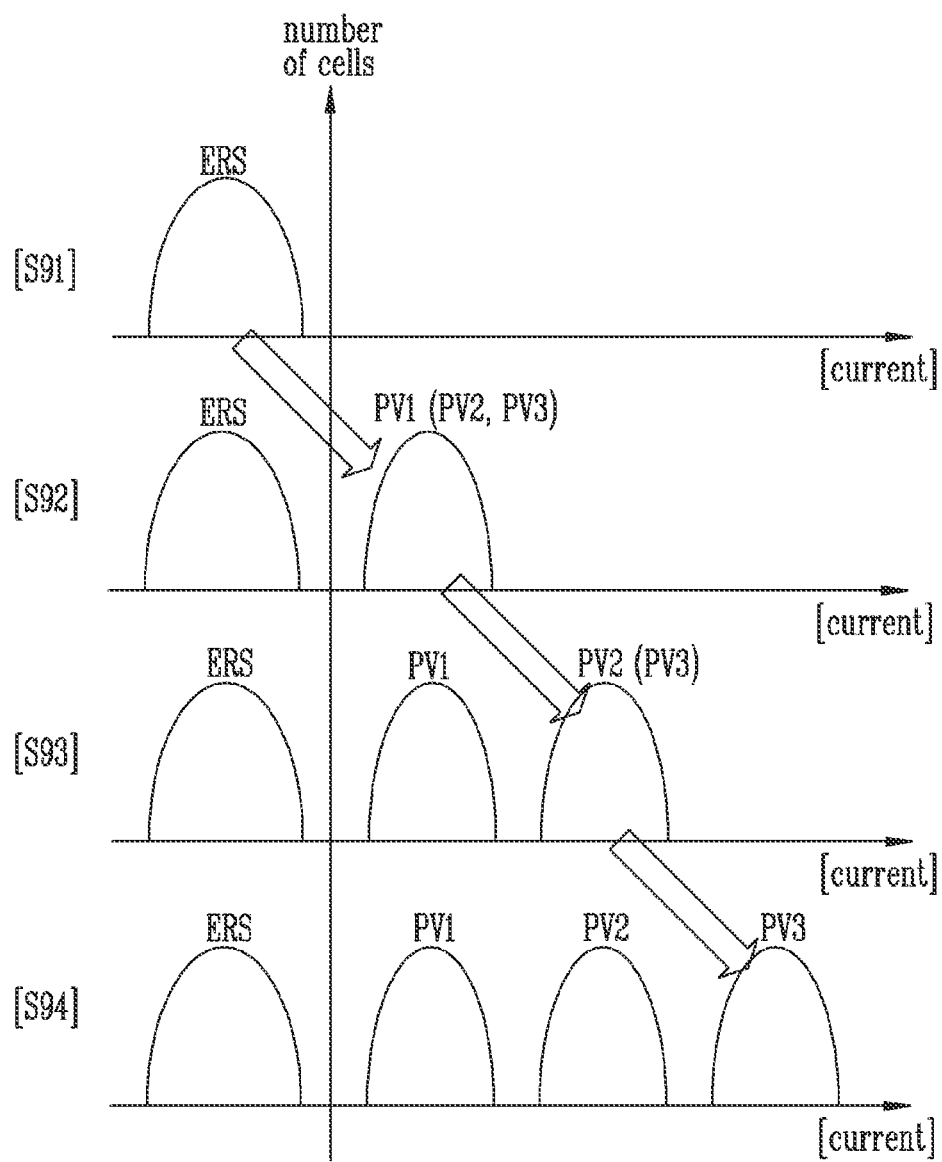
FIG. 10 is a diagram illustrating threshold voltage distributions of memory cells depending on program operations described with reference to FIG. 9.

FIG. 10 is a diagram illustrating threshold voltage distributions of memory cells depending on program operations described with reference to FIG. 9.

A method of programming selected memory cells using a multi-level cell (MLC) scheme will be described below with reference to FIGS. 9 and 10.

After the erase operation S91 has been performed on the selected memory cells, the first program operation S92 of programming the selected memory cells to the first program state PV1 may be performed. The memory cells selected in the first program operation S92 may include memory cells, the target state of which is the first program state PV1, and memory cells to be programmed to the second and third program states PV2 and PV3 higher than the first program state PV1. In other words, the memory cells, the target states of which are the first to third program states PV1 to PV3, may be simultaneously programmed during the first program operation S92. The words "simultaneous" and "simultaneously" as used herein with respect to programming means that the programming takes place on overlapping intervals of time. For example, if a first program takes place over a first interval of time and a second program takes place simultaneously over a second interval of time, then the first and second intervals at least partially overlap each other such that there exists a time at which the first and second programs are both taking place.

When the first program operation S92 is terminated, the second program operation S93 may be performed on memory cells to be programmed to the second or third program state PV2 or PV3, among the memory cells programmed to the first to third program states PV1 to PV3. That is, memory cells, the target state of which is the second or third program state PV2 or PV3, may be simultaneously programmed during the second program operation S93, and may then have the second program state PV2.

When the second program operation S93 is terminated, the third program operation S94 may be performed on the memory cells to be programmed to the third program state PV3, among the memory cells programmed to the second or third program state PV2 or PV3. That is, when k is 3 in the k-th program operation of FIG. 9, the third program operation S94 is the last program to be performed.

As described above, a method of sequentially programming memory cells in ascending order of current is described in detail below.

FIG. 11 is a diagram illustrating a program operation according to a first embodiment of the present disclosure.

Referring to FIG. 11, in the program operation according to the first embodiment, a turn-on voltage that is applied to unselected word lines to program memory cells to various program states may be controlled.

Before the program operation is performed on the selected memory cells, an erase operation may be performed on the selected memory cells. During the erase operation on the selected memory cells, a ground voltage GND may be applied to selected bit lines Sel_BL, and a reset voltage Vreset may be applied to a source line SL. Because the erase operation is performed on all memory cells included in a selected page, all bit lines may be set as the selected bit lines Sel_BL during the erase operation. During the erase operation, a turn-off voltage Voff may be applied to a selected word line Sel_WL, and an erase turn-on voltage eVon may be applied to unselected word lines Unsel_WL. In order to turn on drain select transistors included in the same strings as the selected memory cells, the erase turn-on voltage eVon may be applied to a selected drain select line Sel_DSL. The turn-off voltage Voff may be applied to unselected drain select lines Unsel_DSL.

During a first program operation of programming memory cells, the target state of which is a first program state PV1, among memory cells in an erased state ERS, a set voltage Vset may be applied to the selected bit lines Sel_BL, and the ground voltage GND may be applied to unselected bit lines Unsel_BL. Here, the ground voltage GND may be applied to the source line SL. During the first program operation, the turn-off voltage Voff may be applied to the selected word line Sel_WL, and a first turn-on voltage 1Von may be applied to unselected word lines Unsel_WL. In order to turn on drain select transistors included in the same strings as the selected memory cells, the first turn-on voltage 1Von or a voltage higher than the first turn-on voltage 1Von may be applied to the selected drain select line Sel_DSL. The turn-off voltage Voff may be applied to unselected drain select lines Unsel_DSL.

A second program operation of programming memory cells, the target state of which is a second program state PV2, among the memory cells programmed to the first program state PV1, may be performed in a manner similar to the first program operation. For example, during the second program operation, a second turn-on voltage 2Von higher than the first turn-on voltage 1Von may be applied to the unselected word lines Unsel_WL, and the second turn-on voltage 2Von or a voltage higher than the second turn-on voltage 2Von may be applied to the selected drain select line Sel_DSL. The voltages applied to the remaining lines may be identical to those in the first program operation.

A third program operation of programming memory cells, the target state of which is a third program state PV3, among the memory cells programmed to the second program state PV2, may be performed in a manner similar to the second program operation. For example, during the third program operation, a third turn-on voltage 3Von higher than the second turn-on voltage 2Von may be applied to the unselected word lines Unsel_WL, and the third turn-on voltage 3Von or a voltage higher than the third turn-on voltage 3Von may be applied to the selected drain select line Sel_DSL. The voltages applied to the remaining lines may be identical to those in the first program operation.

A k-th program operation of programming memory cells, the target state of which is a k-th program state PVk which is the highest state, among memory cells programmed to the k−1-th program state PVk−1, may be performed in a manner similar to the k−1-th program operation. For example, during the k-th program operation, the k-th turn-on voltage kVon, which is the highest voltage among the turn-on voltages, may be applied to the unselected word lines Unsel_WL, and the k-th turn-on voltage kVon may also be applied to the selected drain select line Sel_DSL. The voltages applied to the remaining lines may be identical to the voltages applied to the remaining lines in the first program operation.

FIGS. 12A to 12D are diagrams illustrating steps in the program operation according to the first embodiment, wherein a method of programming four memory cells coupled to a selected word line Sel_WL to different states is described below.

Figure 12A:
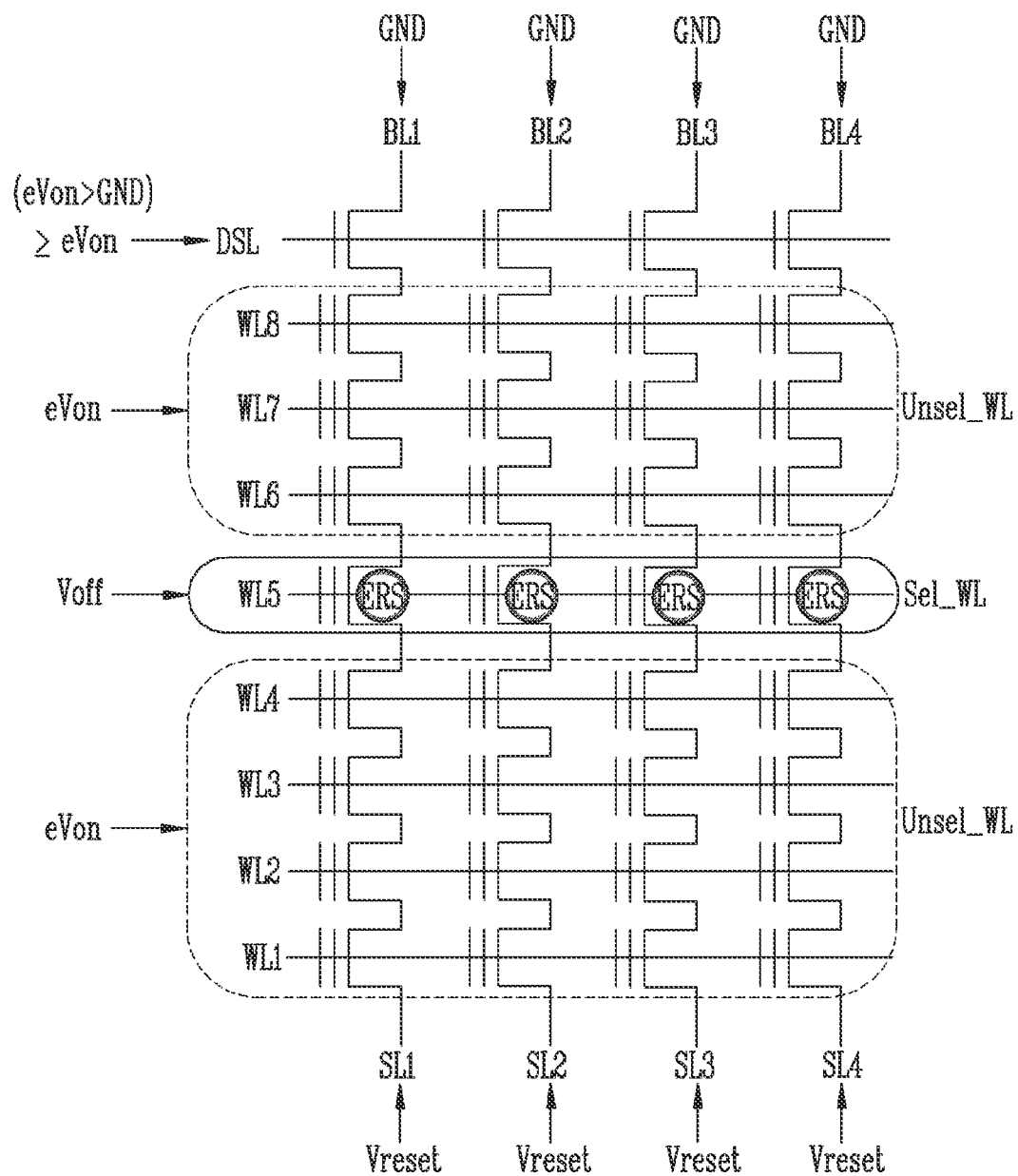
FIGS. 12A, 12B, 12C, and 12D are diagrams illustrating steps of the program operation according to the first embodiment.

Referring to FIG. 12A, it is assumed that the target state of a memory cell coupled to a first bit line BL1 and a selected word line Sel_WL is an erased state ERS, the target state of a memory cell coupled to a second bit line BL2 and the selected word line Sel_WL is a first program state PV1, the target state of a memory cell coupled to a third bit line BL3 and the selected word line Sel_WL is a second program state PV2, and the target state of a memory cell coupled to a fourth bit line BL4 and the selected word line Sel_WL is a fourth program state PV4.

Before the memory cells coupled to the selected word line Sel_WL are programmed, an erase operation of erasing the memory cells coupled to the selected word line Sel_WL may be performed.

During the erase operation, a ground voltage GND may be applied to the first to fourth bit lines BL1 to BL4, and a reset voltage Vreset may be applied to first to fourth source lines SL1 to SL4. A turn-off voltage Voff may be applied to the selected word line Sel_WL, and an erase turn-on voltage eVon may be applied to unselected word lines Unsel_WL. The erase turn-on voltage eVon or a voltage higher than the erase turn-on voltage eVon may be applied to a drain select line DSL.

When the erase turn-on voltage eVon is applied to the unselected word lines Unsel_WL arranged between the selected word line Sel_WL and source lines SL1 to SL4, a current path may be formed between the selected word line Sel_WL and the source lines SL1 to SL4. Therefore, the reset voltage Vreset may be transferred up to the memory cells coupled to the selected word line Sel_WL. When the erase turn-on voltage eVon is applied to the unselected word lines Unsel_WL and the drain select line DSL arranged between the selected word line Sel_WL and bit lines BL1 to BL4, a current path may be formed between the selected word line Sel_WL and the bit lines BL1 to BL4. Therefore, the ground voltage GND may be transferred up to the memory cells coupled to the selected word line Sel_WL.

When the reset voltage Vreset is applied to the bottom of the memory cells coupled to the selected word line Sel_WL and the ground voltage GND is applied to the top of the memory cells, the resistance of the memory cells coupled to the selected word line Sel_WL increases, and thus the memory cells coupled to the selected word line Sel_WL may enter the erased state ERS.

Figure 12B:
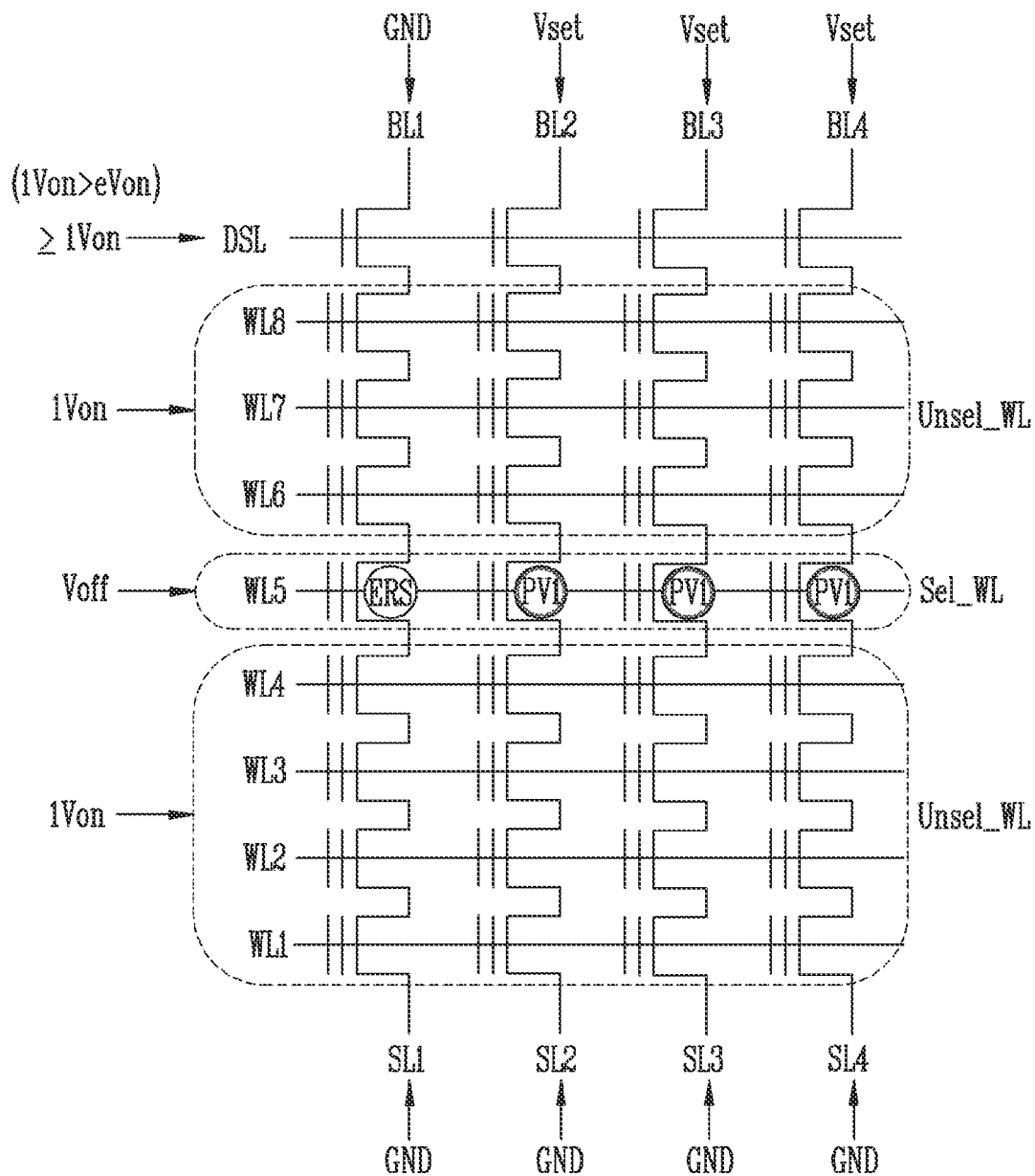

Referring to FIG. 12B, a first program operation may be performed on memory cells to be programmed to the first program state PV1 or higher program states, among memory cells in the erased state ERS. For example, because the target state of a memory cell coupled to the first bit line BL1 and the selected word line Sel_WL is the erased state ERS, the first bit line BL1 is an unselected bit line, and the remaining bit lines, that is, second to fourth bit lines BL2 to BL4, are selected bit lines during the first program operation. When the ground voltage GND is applied in common to the first to fourth source lines SL1 to SL4, the ground voltage GND may be applied to the first bit line BL1, which is the unselected bit line, and a set voltage Vset may be applied to the second to fourth bit lines BL2 to BL4.

In order to transfer the set voltage Vset applied to the second to fourth bit lines BL2 to BL4 up to the selected memory cells, the first turn-on voltage 1Von may be applied to unselected word lines Unsel_WL between the selected word line Sel_WL and the drain select line DSL, and the first turn-on voltage 1Von or a voltage higher than the first turn-on voltage 1Von may be applied to the drain select line DSL. When the voltage higher than the first turn-on voltage 1Von is applied to the drain select line DSL, the set voltage Vset applied to the bit lines may be transferred to the strings without any loss thereof. The first turn-on voltage 1Von may be set to a positive voltage higher than the erase turn-on voltage eVon.

In order to transfer the ground voltage GND applied to the second to fourth source lines SL2 to SL4 up to the selected memory cells, the first turn-on voltage 1Von may also be applied to unselected word lines Unsel_WL between the selected word line Sel_WL and the second to fourth source lines SL2 to SL4.

The first turn-on voltage 1Von may be set to a voltage that is higher than the erase turn-on voltage eVon and lower than the set voltage Vset. Since current between the selected word line Sel_WL and the second to fourth bit lines BL2 to BL4 is determined based on the first turn-on voltage 1Von, the voltage to be applied to the top electrodes of the selected memory cells may be lower than the set voltage Vset applied to the second to fourth bit lines BL2 to BL4. Therefore, the selected memory cells may be programmed to have first resistance. Here, the first resistance may be lower than that of memory cells in an erased state ERS, and may be the highest value, among resistance values the memory cells to be programmed can have.

Figure 12C:
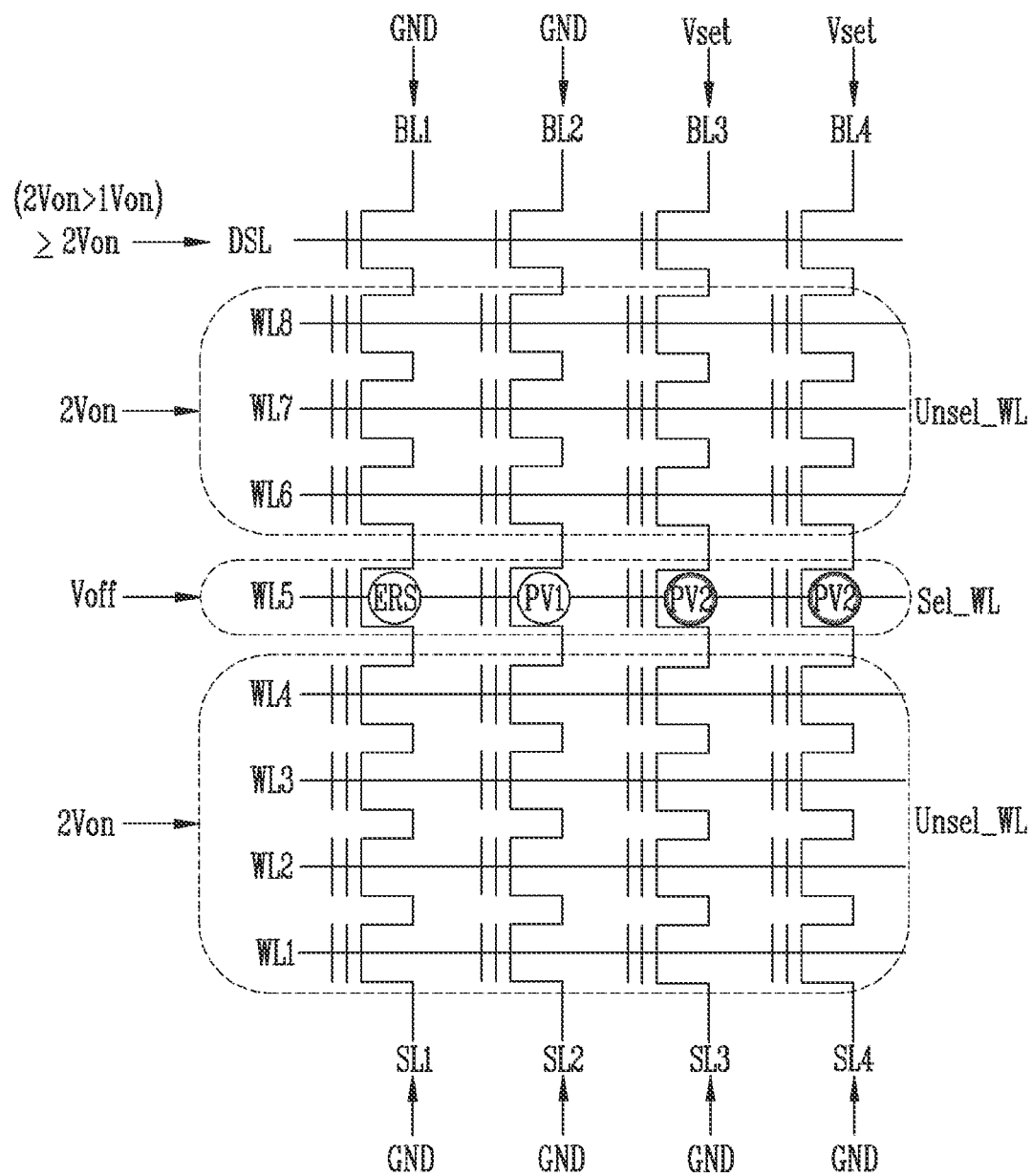

Referring to FIG. 12C, a second program operation may be performed on memory cells to be programmed to the second program state PV2 or higher program states, among the memory cells programmed to the first program state PV1. For example, since memory cells coupled to the first and second bit lines BL1 and BL2 and the selected word line Sel_WL have been programmed to the target state, the first and second bit lines BL1 and BL2 are unselected bit lines and the remaining bit lines, that is, the third and fourth bit lines BL3 and BL4, are selected bit lines during the second program operation. When the ground voltage GND is applied in common to the first to fourth source lines SL1 to SL4, the ground voltage GND may be applied to the first and second bit lines BL1 and BL2, which are the unselected bit lines, and the set voltage Vset may be applied to the third and fourth bit lines BL3 and BL4.

In order to transfer the set voltage Vset applied to the third and fourth bit lines BL3 and BL4 up to the selected memory cells, a second turn-on voltage 2Von higher than the first turn-on voltage 1Von may be applied to unselected word lines Unsel_WL between the selected word line Sel_WL and the drain select line DSL, and the second turn-on voltage 2Von or a voltage higher than the second turn-on voltage 2Von may be applied to the drain select line DSL.

In order to transfer the ground voltage GND applied to the third and fourth source lines SL3 and SL4 up to the selected memory cells, the second turn-on voltage 2Von may also be applied to unselected word lines Unsel_WL between the selected word line Sel_WL and the third and fourth source lines SL3 and SL4.

Because the second turn-on voltage 2Von may be set to a voltage that is higher than the first turn-on 1Von and lower than the set voltage Vset, current between the selected word line Sel_WL and the third and fourth bit lines BL3 and BL4 may be determined based on the second turn-on voltage 2Von. Therefore, the voltage to be applied to the top electrodes of the selected memory cells may be lower than the set voltage Vset applied to the third and fourth bit lines BL3 and BL4. Due thereto, the selected memory cells may be programmed to have second resistance lower than the first resistance.

Figure 12D:
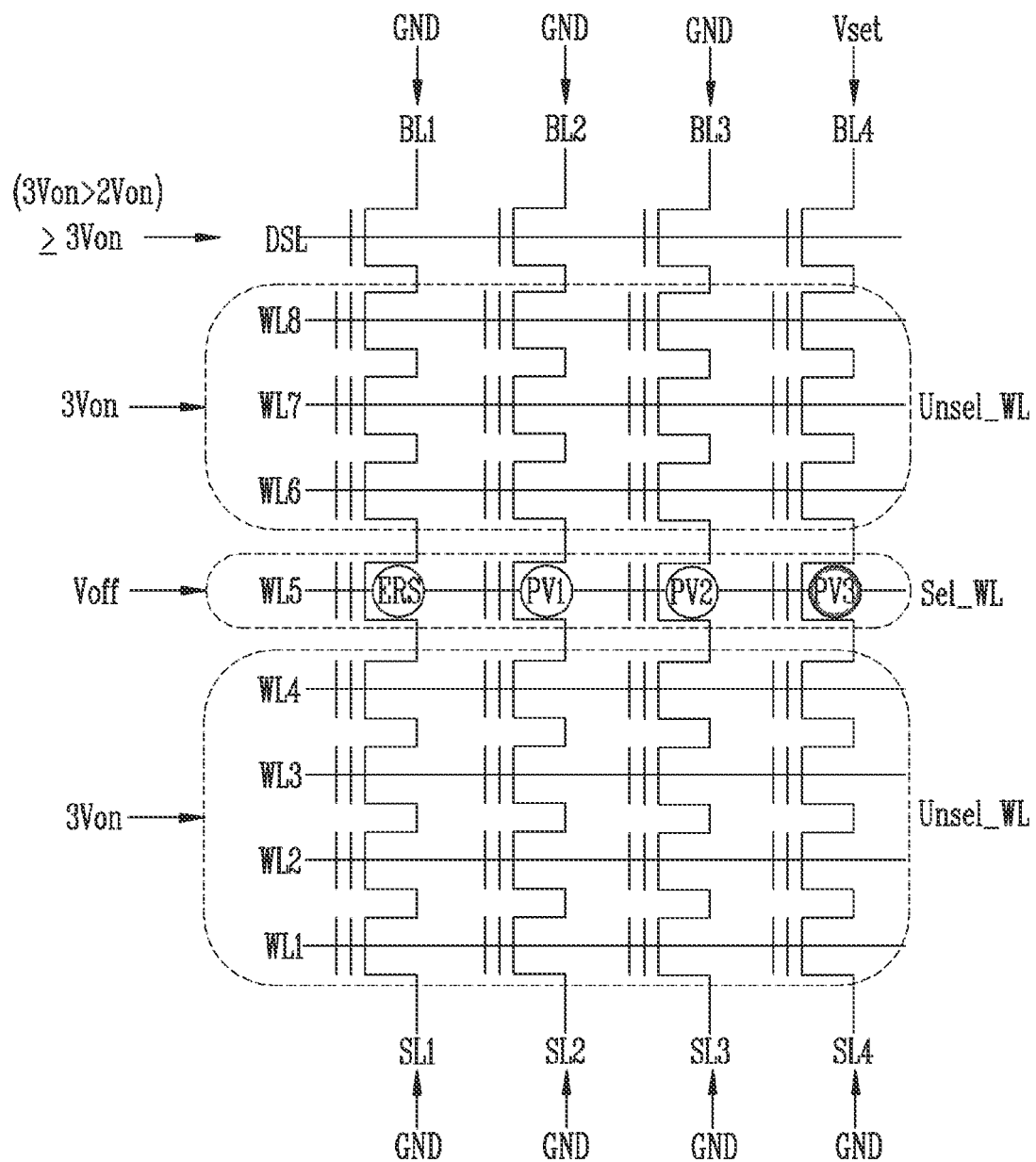

Referring to FIG. 12D, a third program operation may be performed on memory cells to be programmed to the third program state PV3, among the memory cells programmed to the second program state PV2. For example, since memory cells coupled to the first to third bit lines BL1 to BL3 and the selected word line Sel_WL have been programmed to the target state, the first to third bit lines BL1 to BL3 are unselected bit lines and the fourth bit line BL4 is a selected bit line during the third program operation. When the ground voltage GND is applied in common to the first to fourth source lines SL1 to SL4, the ground voltage GND may be applied to the first to third bit lines BL1 to BL3, which are the unselected bit lines, and the set voltage Vset may be applied to the fourth bit line BL4, which is the selected bit line.

In order to transfer the set voltage Vset applied to the fourth bit lines BL4 up to the selected memory cells, a third turn-on voltage 3Von higher than the second turn-on voltage 2Von may be applied to unselected word lines Unsel_WL between the selected word line Sel_WL and the drain select line DSL, and the third turn-on voltage 3Von may be applied to the drain select line DSL.

In order to transfer the ground voltage GND applied to the fourth source line SL4 up to the selected memory cells, the third turn-on voltage 3Von may also be applied to unselected word lines Unsel_WL between the selected word line Sel_WL and the fourth source line SL4.

The third turn-on voltage 3Von may be set to a voltage that is higher than the second turn-on voltage 2Von and lower than or equal to the set voltage Vset. Since current between the selected word line Sel_WL and the fourth bit line BL4 may be determined based on the third turn-on voltage 3Von, the voltage to be applied to the top electrodes of the selected memory cells may be lower than or equal to the set voltage Vset applied to the fourth bit line BL4. Due thereto, the selected memory cells may be programmed to have third resistance lower than the second resistance.

FIG. 13 is a diagram illustrating a program operation according to a second embodiment of the present disclosure.

Referring to FIG. 13, in order to program memory cells to various program states in a program operation according to the second embodiment, a turn-on voltage applied to unselected word lines may be maintained at a uniform voltage, and a reset voltage applied to source lines may be controlled.

Before the program operation is performed on selected memory cells, an erase operation may be performed on the selected memory cells. During the erase operation on the selected memory cells, a set voltage Vset may be applied to selected bit lines Sel_BL, and a ground voltage GND may be applied to source lines SL. Because the set voltage Vset is a positive voltage, the high-resistance state of memory cells is defined as an erased state ERS during the program operation according to the second embodiment. During the erase operation, a turn-off voltage Voff may be applied to a selected word line Sel_WL, and a turn-on voltage Von may be applied to unselected word lines Unsel_WL. The turn-on voltage Von may be set to the highest voltage among first to k-th turn-on voltages 1Von to kVon used in the program operation according to the first embodiment. For example, the turn-on voltage Von used in the program operation according to the second embodiment may be the k-th turn-on voltage kVon used in the program operation according to the first embodiment. In order to turn on drain select transistors included in the same strings as the selected memory cells, the turn-on voltage Von may be applied to a selected drain select line Sel_DSL, and the turn-off voltage Voff may be applied to unselected drain select lines Unsel_DSL.

In order to simultaneously program the selected memory cells, among memory cells in the erased state ERS, to first to k-th program states PV1 to PVk, first to k-th reset voltages 1Vreset to kVreset may be selectively applied to the source lines SL coupled to strings. For example, during the program operation, the ground voltage GND may be applied to the bit lines BL, the turn-off voltage Voff may be applied to the selected word line Sel_WL and unselected drain select lines Unsel_DSL, and the turn-on voltage Von may be applied to the unselected word lines Unsel_WL and the selected drain select line Sel_DSL.

The first to k-th reset voltages 1Vreset to kVreset applied to the source lines SL are described in detail below.

The first reset voltage 1Vreset lower than the ground voltage GND may be applied to the source line SL coupled to the string of a memory cell to be programmed to the first program state PV1. The first program state PV1 may be defined as a first low resistance state lower than the erased state ERS. Therefore, the current of the memory cell programmed to the first program state PV1 is greater than that of the memory cells in the erased state ERS.

The second reset voltage 2Vreset lower than the first reset voltage 1Vreset may be applied to the source line SL coupled to the string of the memory cell to be programmed to the second program state PV2. The second program state PV2 may be defined as a second low resistance state having resistance lower than that of the first program state PV1. Therefore, the current of the memory cell programmed to the second program state PV2 is greater than that of the memory cells programmed to the first program state PV1.

Through the above-described scheme, in order to program the selected memory cells to third to k-th program states PV3 to PVk, the remaining reset voltages, that is, the third to k-th reset voltages 3Vreset to kVreset, may be applied to source lines SL coupled to respective strings. All of the first to k-th reset voltages 1Vreset to kVreset may be set to voltages lower than the ground voltage GND, and the k-th reset voltage kVreset, among the first to k-th reset voltages 1Vreset to kVreset, may be set to the lowest voltage.

Figure 14A:
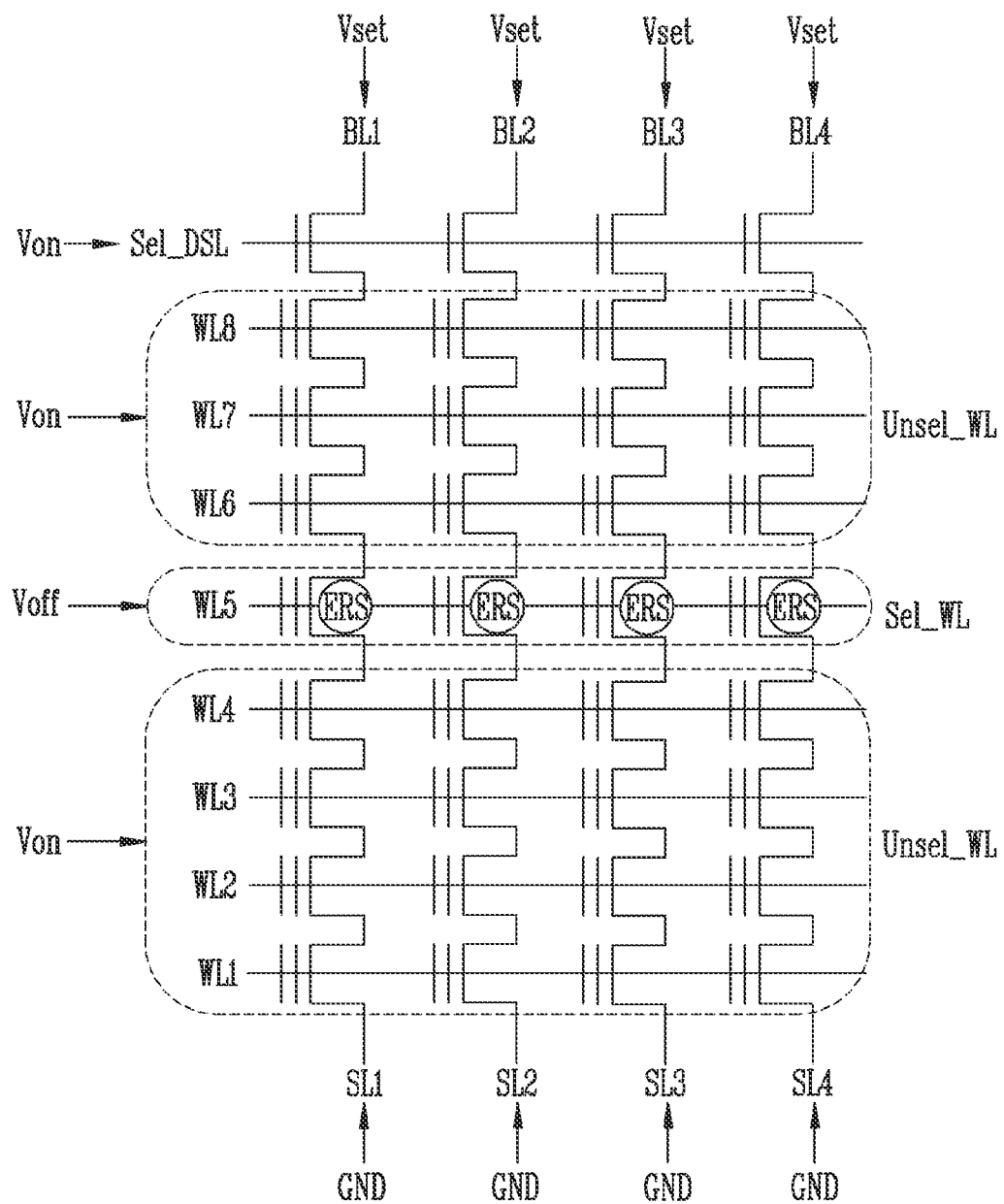
FIGS. 14A and 14B are diagrams illustrating steps of the program operation according to the second embodiment.
Figure 14B:
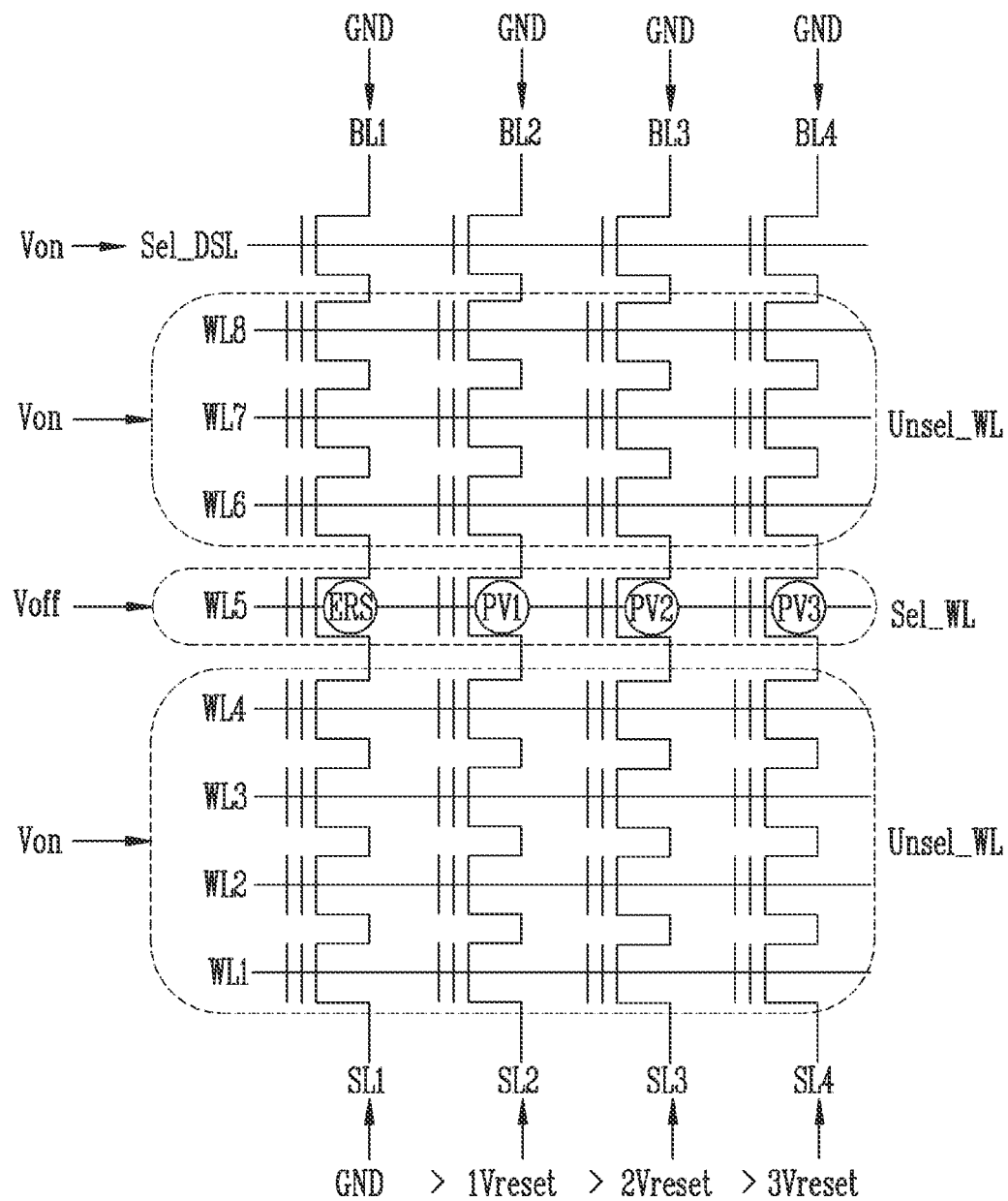

FIGS. 14A and 14B are diagrams illustrating steps of the program operation according to the second embodiment.

Referring to FIG. 14A, it is assumed that the target state of a memory cell coupled to a first bit line BL1 and a selected word line Sel_WL is an erased state ERS, the target state of a memory cell coupled to a second bit line BL2 and the selected word line Sel_WL is a first program state PV1, the target state of a memory cell coupled to a third bit line BL3 and the selected word line Sel_WL is a second program state PV2, and the target state of a memory cell coupled to a fourth bit line BL4 and the selected word line Sel_WL is a fourth program state PV4.

Before the memory cells coupled to the selected word line Sel_WL are programmed, an erase operation of erasing the memory cells coupled to the selected word line Sel_WL may be performed.

During the erase operation, the set voltage Vset may be applied to the first to fourth bit lines BL1 to BL4, and the ground voltage GND may be applied to the first to fourth source lines SL1 to SL4. The turn-off voltage Voff may be applied to the selected word line Sel_WL, and the turn-on voltage Von may be may be applied to the unselected word lines Unsel_WL and the selected drain select line Sel_DSL.

The turn-on voltage Von may be set to the highest voltage among first to k-th turn-on voltages 1Von to kVon used in the program operation according to the first embodiment. For example, the k-th turn-on voltage kVon used in the program operation according to the first embodiment may be set to the turn-on voltage Von in the program operation according to the second embodiment.

When the turn-on voltage Von is applied to the unselected word lines Unsel_WL arranged between the selected word line Sel_WL and source lines SL1 to SL4, a current path may be formed between the selected word line Sel_WL and the source lines SL1 to SL4. Therefore, the ground voltage GND may be transferred up to the memory cells coupled to the selected word line Sel_WL. When the turn-on voltage Von is applied to the unselected word lines Unsel_WL and the drain select line DSL arranged between the selected word line Sel_WL and bit lines BL1 to BL4, a current path may be formed between the selected word line Sel_WL and the bit lines BL1 to BL4. Therefore, the set voltage Vset may be transferred up to the memory cells coupled to the selected word line Sel_WL.

When the ground voltage GND is applied to the bottom of the memory cells coupled to the selected word line Sel_WL and the set voltage Vset is applied to the top of the memory cells, the resistance of the memory cells coupled to the selected word line Sel_WL increases, and thus the memory cells coupled to the selected word line Sel_WL may enter the erased state ERS.

Referring to FIG. 14B, in order to program selected memory cells to first to third program states PV1 to PV3, the turn-off voltage Voff may be applied to a selected word line Sel_WL, and the turn-on voltage Von may be applied to unselected word lines Unsel_WL and a selected drain select line Sel_DSL. The ground voltage GND may be applied to first to fourth bit lines BL1 to BL4, and different voltages may be applied to first to fourth source lines SL1 to SL4 depending on the target states of the selected memory cells. For example, when the target state of a memory cell coupled to the first source line SL1 and the selected word line Sel_WL is the erased state ERS, the memory cell has already been erased through an erase operation, and thus the ground voltage GND may be applied to the first source line SL1.

When the target state of a selected memory cell coupled to the second source line SL2 is the first program state PV1, the first reset voltage 1Vreset lower than the ground voltage GND may be applied to the second source line SL2. When the target state of a selected memory cell coupled to the third source line SL3 is the second program state PV2, the second reset voltage 2Vreset lower than the first reset voltage 1Vreset may be applied to the third source line SL3. When the target state of a selected memory cell coupled to the fourth source line SL4 is the third program state PV3, the third reset voltage 3Vreset lower than the second reset voltage 2Vreset may be applied to the fourth source line SL4.

FIG. 15 is a diagram illustrating a program operation according to a third embodiment of the present disclosure.

Referring to FIG. 15, in order to perform the program operation according to the third embodiment, a source select line is additionally provided between word lines and a source line. For example, source select transistors may be added between memory cells and the source line, and the source select line may be coupled to gates of the source select transistors. The source select line SSL may be coupled in common to different bit lines as in the case of the drain select line DSL, and source select lines coupled to the same bit line may be separated. During the program operation according to the third embodiment, selected memory cells may be programmed by controlling the voltage to be applied to a selected source select line Sel_SSL.

Before the program operation is performed on selected memory cells, an erase operation may be performed on the selected memory cells. During the erase operation on the selected memory cells, a ground voltage GND may be applied to the first to fourth bit lines BL1 to BL4, and a reset voltage Vreset may be applied to source lines SL. Because the erase operation is performed on all memory cells included in a selected page, all bit lines may be set as selected bit lines Sel_BL during the erase operation. During the erase operation, a turn-off voltage Voff may be applied to a selected word line Sel_WL, and an erase turn-on voltage eVon may be applied to unselected word lines Unsel_WL. In order to turn on drain select transistors included in the same strings as the selected memory cells, the erase turn-on voltage eVon may also be applied to a selected drain select line Sel_DSL. The turn-off voltage Voff may be applied to unselected drain select lines Unsel_DSL.

During a first program operation of programming memory cells, the target state of which is a first program state PV1, among memory cells in an erased state ERS, a set voltage Vset may be applied to the selected bit lines Sel_BL, and the ground voltage GND may be applied to unselected bit lines Unsel_BL. The ground voltage GND may be applied to the source line SL. During the first program operation, the turn-off voltage Voff may be applied to a selected word line Sel_WL, and a k-th turn-on voltage kVon may be applied to unselected word lines Unsel_WL. The k-th turn-on voltage kVon may be identical to the highest voltage, among the first to k-th turn-on voltages 1Von to kVon used in the program operation according to the first embodiment. In order to turn on drain select transistors included in the same strings as the selected memory cells, the k-th turn-on voltage kVon may also be applied to a selected drain select line Sel_DSL, and the turn-off voltage Voff may be applied to unselected drain select lines Unsel_DSL. In order to program the memory cells, the target state of which is the first program state PV1, to the first program state PV1, the first turn-on voltage 1Von may be applied to a selected source select line Sel_SSL. That is, when the first turn-on voltage 1Von, which is the lowest voltage among the first to k-th turn-on voltages 1Von to kVon, is applied to the selected source select line Sel_SSL, the turn-on level of the source select transistors decreases, and thus the level of a current path between the source line SL to which the ground voltage GND is applied and selected memory cells may decrease. Due thereto, since the selected memory cells enter a first low-resistance state lower than that in the erased state ERS, the selected memory cells may be programmed to the first program state PV1.

A second program operation of programming memory cells, the target state of which is a second program state PV2, among the memory cells programmed to the first program state PV1, may be performed in a manner similar to the first program operation. For example, during the second program operation, a second turn-on voltage 2Von higher than the first turn-on voltage 1Von may be applied to a selected source select line Sel_SSL. The voltages applied to the remaining lines may be identical to those in the first program operation.

A third program operation of programming memory cells, the target state of which is a third program state PV3, among the memory cells programmed to the second program state PV2, may be performed in a manner similar to the first program operation. For example, during the third program operation, a third turn-on voltage 3Von higher than the second turn-on voltage 2Von may be applied to a selected source select line Sel_SSL. The voltages applied to the remaining lines may be identical to those in the first program operation.

A k-th program operation of programming memory cells, the target state of which is a k-th program state PVk, among memory cells programmed to a k−1-th program state PVk−1, may be performed in a manner similar to the first program operation. For example, during the k-th program operation, the k-th turn-on voltage, which is the highest turn-on voltage among the first to k-th turn-on voltages 1Von to kVon, may be applied to the selected source select line Sel_SSL. The voltages applied to the remaining lines may be identical to those in the first program operation.

FIGS. 16A to 16D are diagrams illustrating steps of the program operation according to the third embodiment.

Figure 16A:
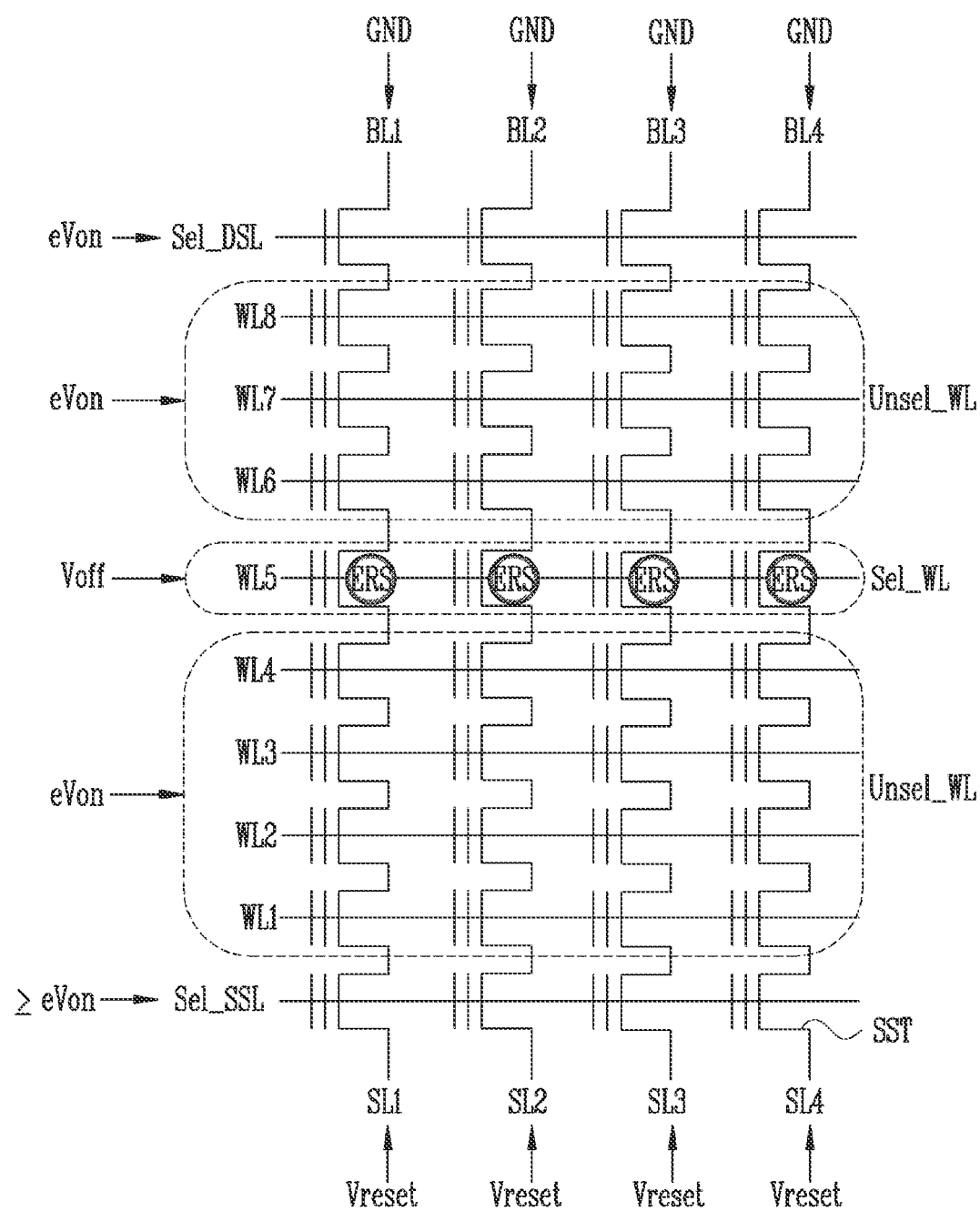

Referring to FIG. 16A, it is assumed that the target state of a memory cell coupled to a first bit line BL1 and a selected word line Sel_WL is an erased state ERS, the target state of a memory cell coupled to a second bit line BL2 and the selected word line Sel_WL is a first program state PV1, the target state of a memory cell coupled to a third bit line BL3 and the selected word line Sel_WL is a second program state PV2, and the target state of a memory cell coupled to a fourth bit line BL4 and the selected word line Sel_WL is a fourth program state PV4.

Before the memory cells coupled to the selected word line Sel_WL are programmed, an erase operation of erasing the memory cells coupled to the selected word line Sel_WL may be performed.

During the erase operation, a ground voltage GND may be applied to the first to fourth bit lines BL1 to BL4, and a reset voltage Vreset may be applied to first to fourth source lines SL1 to SL4. A turn-off voltage Voff may be applied to the selected word line Sel_WL, and an erase turn-on voltage eVon may be applied to unselected word lines Unsel_WL. The erase turn-on voltage eVon or a voltage higher than the erase turn-on voltage eVon may be applied to a selected drain select line Sel_DSL.

When the erase turn-on voltage eVon is applied to the unselected word lines Unsel_WL arranged between the selected word line Sel_WL and source lines SL1 to SL4, a current path may be formed between the selected word line Sel_WL and the source lines SL1 to SL4. Therefore, the reset voltage Vreset may be transferred up to the memory cells coupled to the selected word line Sel_WL. When the erase turn-on voltage eVon is applied to the unselected word lines Unsel_WL and the selected drain select line Sel_DSL, which are arranged between the selected word line Sel_WL and bit lines BL1 to BL4, a current path may be formed between the selected word line Sel_WL and the bit lines BL1 to BL4. Therefore, the ground voltage GND may be transferred up to the memory cells coupled to the selected word line Sel_WL.

When the reset voltage Vreset is applied to the bottom of the memory cells coupled to the selected word line Sel_WL and the ground voltage GND is applied to the top of the memory cells, the resistance of the memory cells coupled to the selected word line Sel_WL increases, and thus the memory cells coupled to the selected word line Sel_WL may enter an erased state ERS.

Figure 16B:
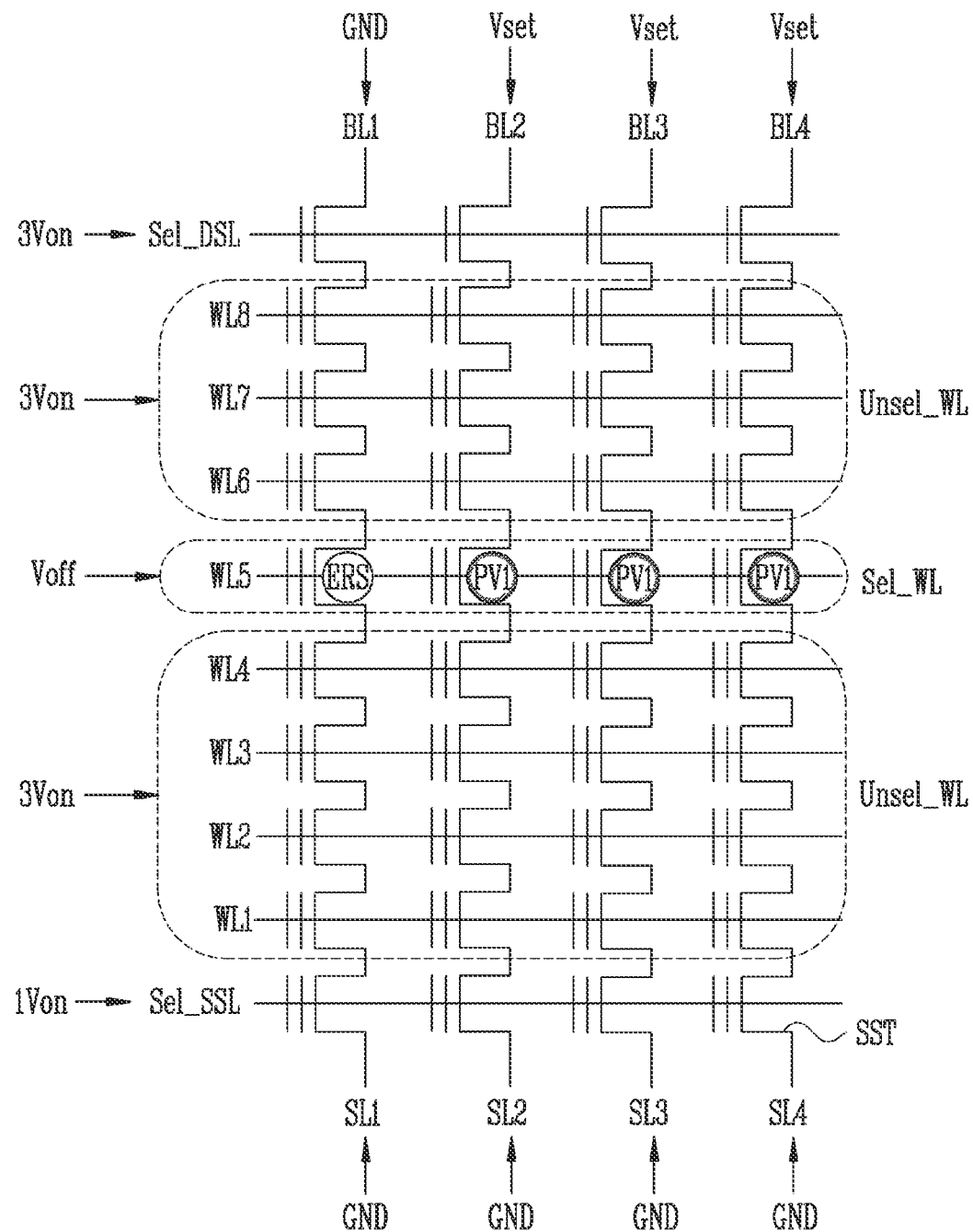

Referring to FIG. 16B, a first program operation may be performed on memory cells to be programmed to a first program state PV1 or higher program states, among memory cells in the erased state ERS. For example, because the target state of a memory cell coupled to the first source line SL1 and the selected word line Sel_WL is the erased state ERS, the first bit line BL1 is an unselected bit line, and the remaining bit lines, that is, second to fourth bit lines BL2 to BL4, are selected bit lines during the first program operation.

When the ground voltage GND is applied in common to the first to fourth source lines SL1 to SL4, the ground voltage GND may be applied to the first bit line BL1, which is the unselected bit line, and a set voltage Vset may be applied to the second to fourth bit lines BL2 to BL4, which are selected bit lines.

In order to transfer the set voltage Vset applied to the second to fourth bit lines BL2 to BL4 up to the selected memory cells, the highest turn-on voltage among the turn-on voltages may be applied to unselected word lines Unsel_WL between the selected word line Sel_WL and the selected drain select line Sel_DSL. For example, when the highest state among the target states of the memory cells is the third program state PV3, the third turn-on voltage 3Von corresponding to the third program state PV3 may be applied to the unselected word lines Unsel_WL. The third turn-on voltage 3Von may also be applied to the selected drain select line Sel_DSL. The third turn-on voltage 3Von may be set to a positive voltage lower than the set voltage Vset.

In order to transfer the ground voltage GND applied to the first to fourth source lines SL1 to SL4 up to the selected memory cells, the third turn-on voltage 3Von may also be applied to unselected word lines Unsel_WL between the selected word line Sel_WL and the first to fourth source lines SL1 to SL4.

The first turn-on voltage 1Von lower than the third turn-on voltage 3Von may be applied to the selected source select line Sel_SSL. That is, in order to program the selected memory cells to the first program state PV1, the first turn-on voltage 1Von corresponding to the first program state PV1 may be applied to the selected source select line Sel_SSL.

Since current between the selected word line Sel_WL and the second to fourth source lines SL2 to SL4 may be determined based on the first turn-on voltage 1Von applied to the selected source line Sel_SSL, the voltage applied to the bottom electrodes of the selected memory cells may be higher than the ground voltage GND applied to the second to fourth source lines SL2 to SL4. Therefore, the selected memory cells may be programmed to have first resistance.

Referring to FIG. 16C, a second program operation may be performed on memory cells to be programmed to the second program state PV2 or higher program states, among the memory cells programmed to the first program state PV1. For example, since the target state of the memory cells coupled to the first and second source lines SL1 and SL2 and the selected word line Sel_WL is the erased state ERS or the first program state PV1, the first and second bit lines BL1 and BL2 are unselected bit lines and the third and fourth bit lines BL3 and BL4 are selected bit lines during the second program operation.

When the ground voltage GND is applied in common to the first to fourth source lines SL1 to SL4, the ground voltage GND may be applied to the first and second bit lines BL1 and BL2, which are the unselected bit lines, and the set voltage Vset may be applied to the third and fourth bit lines BL3 and BL4, which are the selected bit lines.

In order to transfer the set voltage Vset applied to the third and fourth bit lines BL3 and BL4 up to the selected memory cells, the third turn-on voltage 3Von may be applied to unselected word lines Unsel_WL between the selected word line Sel_WL and the selected drain select line Sel_DSL. The third turn-on voltage 3Von may also be applied to the selected drain select line Sel_DSL.

In order to transfer the ground voltage GND applied to the first to fourth source lines SL1 to SL4 up to the selected memory cells, the third turn-on voltage 3Von may also be applied to unselected word lines Unsel_WL between the selected word line Sel_WL and the first to fourth source lines SL1 to SL4.

The second turn-on voltage 2Von that is lower than the third turn-on voltage 3Von and higher than the first turn-on voltage 1Von may be applied to the selected source select line Sel_SSL. That is, in order to program the selected memory cells to the second program state PV2, the second turn-on voltage 2Von corresponding to the second program state PV2 may be applied to the selected source select line Sel_SSL.

Since current between the selected word line Sel_WL and the third and fourth source lines SL3 and SL4 may be determined based on the second turn-on voltage 2Von applied to the selected source select line Sel_SSL, the voltage applied to the bottom electrodes of the selected memory cells may be higher than the ground voltage GND applied to the third and fourth source lines SL3 and SL4. Therefore, the selected memory cells may be programmed to have second resistance lower than the first resistance.

Figure 16D:
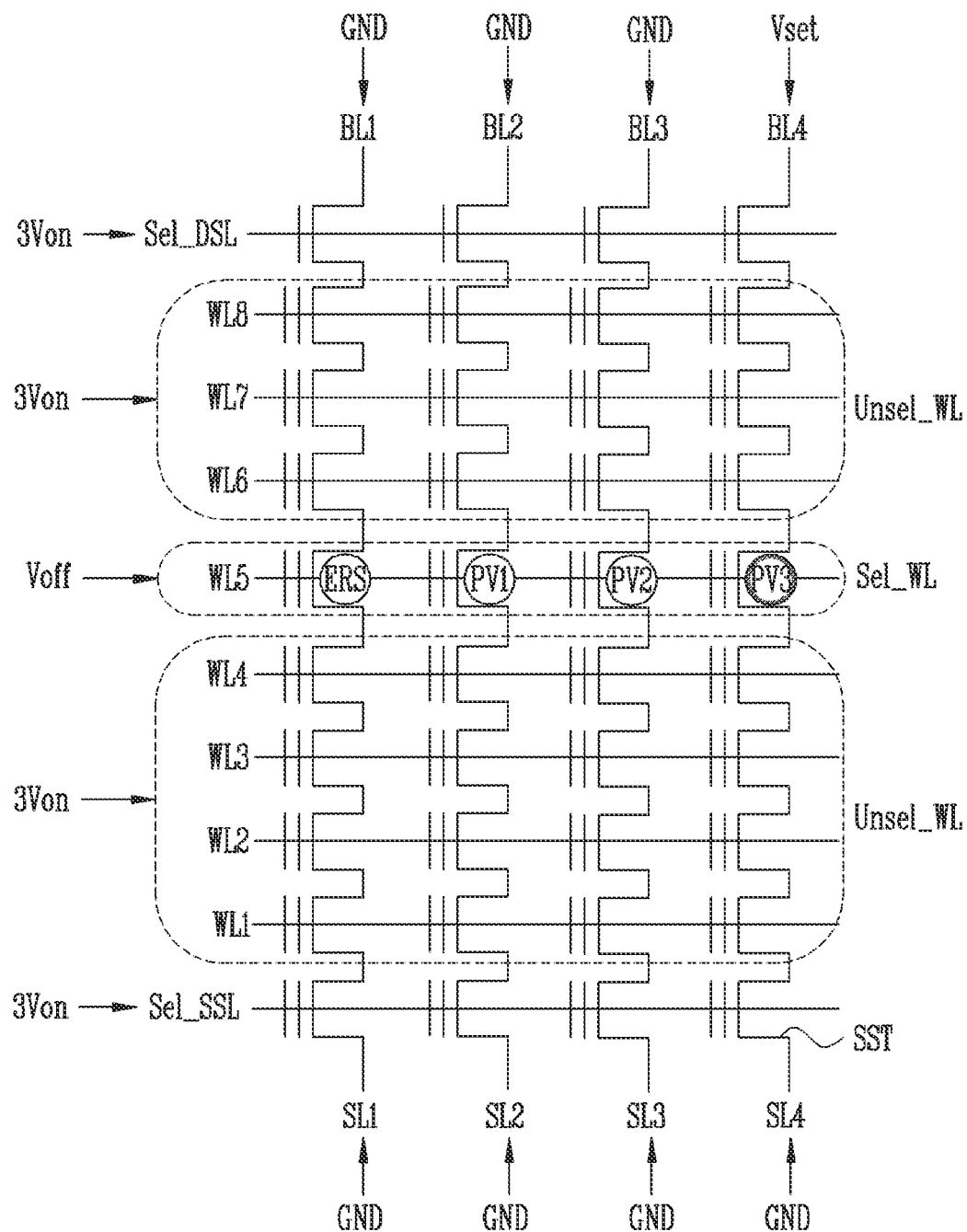

Referring to FIG. 16D, a third program operation may be performed on memory cells to be programmed to the third program state PV3, among the memory cells programmed to the second program state PV2. For example, since the target state of the memory cells coupled to the first to third source lines SL1 to SL3 and the selected word line Sel_WL is the erased state ERS or any one of the first to second program states PV1 to PV2, the first to third bit lines BL1 to BL3 are unselected bit lines and the fourth bit line BL4 is the selected bit line during the third program operation.

When the ground voltage GND is applied in common to the first to fourth source lines SL1 to SL4, the ground voltage GND may be applied to the first to third bit lines BL1 to BL3, which are the unselected bit lines, and the set voltage Vset may be applied to the fourth bit line BL4, which is the selected bit line.

In order to transfer the set voltage Vset applied to the fourth bit line BL4 up to the selected memory cells, the third turn-on voltage 3Von may be applied to unselected word lines Unsel_WL between the selected word line Sel_WL and the selected drain select line Sel_DSL. The third turn-on voltage 3Von may also be applied to the selected drain select line Sel_DSL.

In order to transfer the ground voltage GND applied to the first to fourth source lines SL1 to SL4 up to the selected memory cells, the third turn-on voltage 3Von may also be applied to unselected word lines Unsel_WL between the selected word line Sel_WL and the first to fourth source lines SL1 to SL4.

The third turn-on voltage 3Von may also be applied to the selected source select line Sel_SSL. That is, in order to program the selected memory cells to the third program state PV3, the third turn-on voltage 3Von corresponding to the third program state PV3 may be applied to the selected source select line Sel_SSL.

Because current between the selected word line Sel_WL and the fourth source line SL4 may be determined based on the third turn-on voltage 3Von applied to the selected source select line Sel_SSL, the ground voltage GND applied to the fourth source line SL4 may be transferred to the bottom electrodes of the selected memory cells. Therefore, the selected memory cells may be programmed to have third resistance lower than the second resistance.

The program operations according to the foregoing first to third embodiments may be performed in combination with each other. For example, when a turn-on voltage applied to unselected word lines Unsel_WL is controlled depending on the target state of selected memory cells, reset voltages applied to selected source lines or turn-on voltages applied to selected source select lines may be simultaneously controlled.

Figure 17:
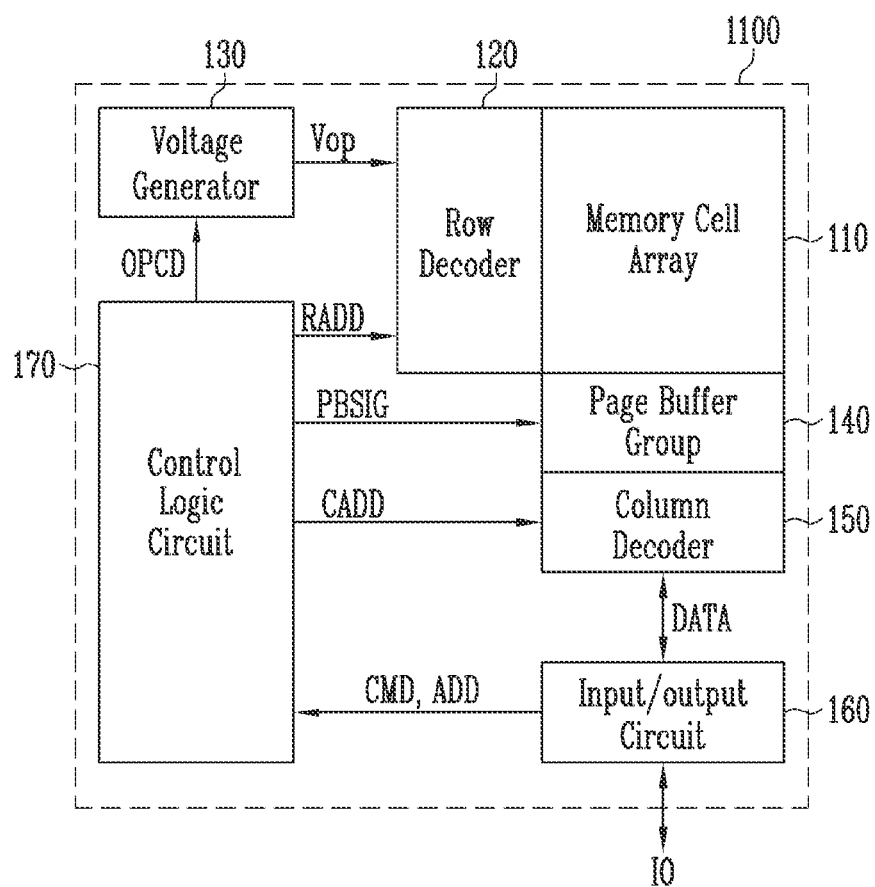
FIG. 17 is a diagram illustrating a memory device according to the present disclosure.

FIG. 17 is a diagram illustrating a memory device according to the present disclosure.

Referring to FIG. 17, a memory device 1100 may include a memory cell array 110 in which data is stored, and peripheral circuits 120 to 170 which can perform a program operation, a read operation or an erase operation.

The memory cell array 110 may include a plurality of memory blocks which data is stored. Each of the memory blocks may include a plurality of memory cells, and the memory cells may be implemented as resistive memory cells according to the foregoing embodiments.

The peripheral circuits 120 to 170 may include a row decoder 120, a voltage generator 130, a page buffer group 140, a column decoder 150, an input/output circuit 160, and a control logic circuit 170.

The row decoder 120 may select a single memory block from among the memory blocks included in the memory cell array 110 in response to a row address RADD, and may transmit operating voltages Vop to word lines, drain select lines, and source select lines coupled to the selected memory block.

The voltage generator 130 may generate and output the operating voltages Vop required for various operations in response to an operation code OPCD. For example, the voltage generator 130 may generate the operating voltage Vop including a ground voltage, a set voltage, reset voltages, turn-on voltages, an erase turn-on voltage, a turn-off voltage, read voltages, erase voltages, verify voltages, etc. in response to the operation code OPCD, and may selectively output the generated operating voltages. The voltage generator 130 may control the levels of the turn-on voltages to be applied to unselected word lines depending on the target states of selected memory cells in response to the operation code OPCD. The voltage generator 130 may control the levels of the reset voltages to be applied to selected source lines depending on the target states of selected memory cells in response to the operation code OPCD. The voltage generator 130 may control the levels of the turn-on voltages to be applied to selected source select lines depending on the target states of selected memory cells in response to the operation code OPCD.

The page buffer group 140 may be coupled to the memory cell array 110 through bit lines. For example, the page buffer group 140 may include page buffers coupled to respective bit lines. The page buffers may be simultaneously operated in response to page buffer control signals PBSIG, and may temporarily store data during a program or read operation. The page buffers may sense the voltages of bit lines varying with the threshold voltages of memory cells during a read operation or verify operation. That is, based on the result of a sensing operation performed by the page buffers, whether threshold voltages of the memory cells are lower or higher than a read voltage or a verify voltage may be determined.

The column decoder 150 may transfer data DATA between the input/output circuit 160 and the page buffer group 140 in response to a column address CADD.

The input/output circuit 160 may be coupled to a controller through input/output lines IO. The input/output circuit 160 may receive/output a command CMD, an address ADD, and data DATA through the input/output lines IO. For example, the input/output circuit 160 may transmit the command CMD and the address ADD, received through the input/output lines IO, to the control logic circuit 170, and may transmit the data DATA, received through the input/output lines IO, to the column decoder 150. The input/output circuit 160 may output the data DATA, received from the column decoder 150, to the controller through the input/output lines IO.

The control logic circuit 170 may output the operation code OPCD, the row address RADD, the page buffer control signals PBSIG, and the column address CADD in response to the command CMD and the address ADD. For example, the control logic circuit 170 may include software which executes an algorithm in response to the command CMD, and hardware which outputs various signals depending on the address ADD and the algorithm. The control logic circuit 170 may perform a program operation based on a set scheme, among schemes in the foregoing first to third embodiments.

Figure 18:
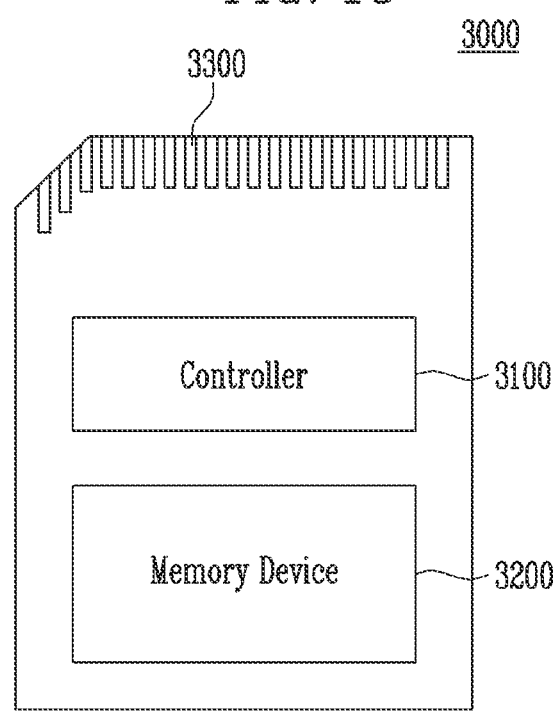
FIG. 18 is a diagram illustrating a memory card system to which a memory device according to the present disclosure is applied.

FIG. 18 is a diagram illustrating a memory card system to which a memory device according to the present disclosure is applied.

Referring to FIG. 18, a memory card system 3000 may include a controller 3100, a memory device 3200, and a connector 3300.

The controller 3100 may be coupled to the memory device 3200. The memory device 3200 may be configured in the same manner as the memory device 1100 illustrated in FIG. 17. The controller 3100 may access the memory device 3200. For example, the controller 3100 may control a program, a read, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as a random access memory (RAM), a processor, a host interface, a memory interface, and an error correction block.

The controller 3100 may communicate with an external device through the connector 3300. The controller 3100 may communicate with an external device (e.g., a host) based on a specific communication protocol. In an embodiment, the controller 3100 may communicate with the external device through at least one of various interface protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WIFI, Bluetooth, and nonvolatile memory express (NVMe) protocols. In an embodiment, the connector 3300 may be defined by at least one of the above-described various communication protocols.

The controller 3100 and the memory device 3200 may be integrated into a single semiconductor device to form a memory card. For example, the controller 3100 and the memory device 3200 may be integrated into a single semiconductor device, and may then form a memory card such as a personal computer memory card international association (PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 19:
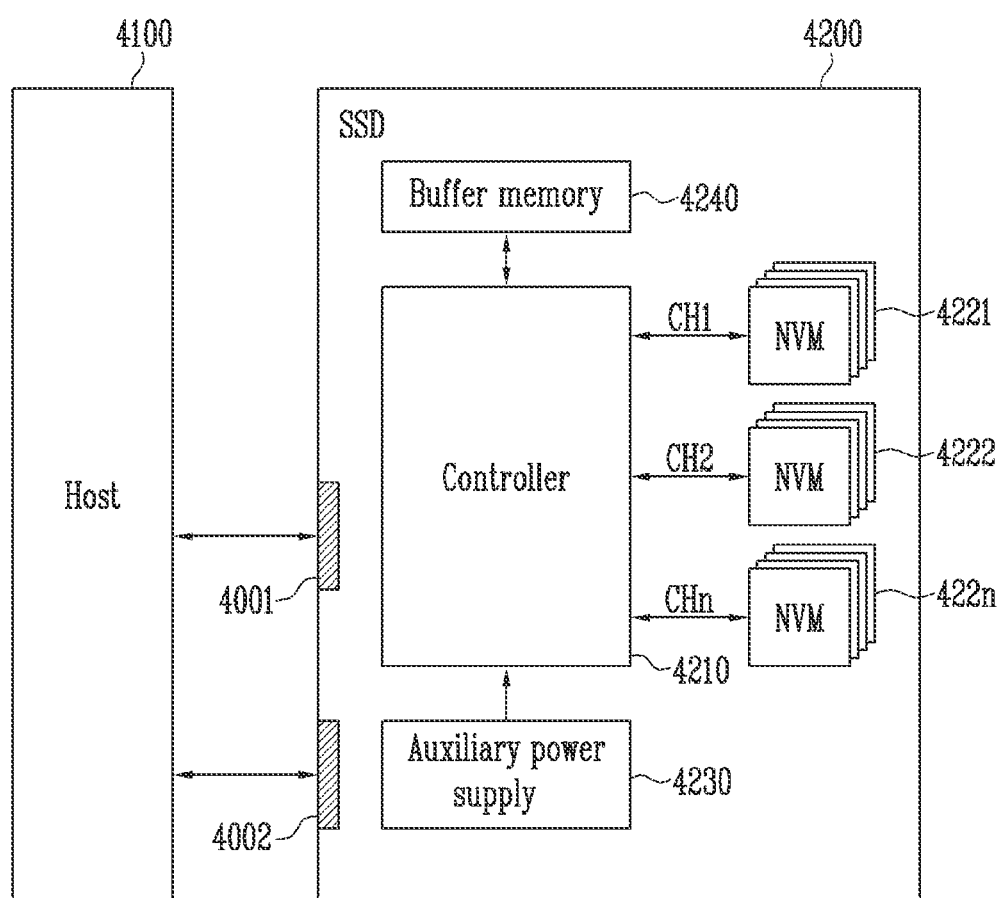
FIG. 19 is a diagram illustrating a solid state drive (SSD) system to which a memory device according to the present disclosure is applied.

FIG. 19 is a diagram illustrating a solid state drive (SSD) system to which a memory device according to the present disclosure is applied.

Referring to FIG. 19, an SSD system 4000 includes a host 4100 and an SSD 4200. The SSD 4200 may exchange signals with the host 4100 through a signal connector 4001, and may receive power PWR through a power connector 4002. The SSD 4200 may include a controller 4210, memory devices 4221 to 422n, an auxiliary power supply 4230, and a buffer memory 4240.

In accordance with an embodiment of the present disclosure, each of the memory devices 4221 to 422n may be configured in the same manner as the memory device 1100 described with reference to FIG. 17.

The controller 4210 may control the memory devices 4221 to 422n in response to signals received from the host 4100. In an embodiment, the signals may be signals based on the interfaces of the host 4100 and the SSD 4200. For example, such a signal may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied with a supply voltage from the host 4100, and may be charged with the supply voltage. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may function as a buffer memory of the SSD 4200. For example, the buffer memory 4240 may temporarily store data received from the host 4100 or data received from the memory devices 4221 to 422n, or may temporarily store metadata (e.g., mapping tables) of the memory devices 4221 to 422n. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

The present disclosure, in an embodiment, may store two or more bits of data in each of memory cells constituting a resistive memory device, thus increasing the storage capacity of the resistive memory device.

What is claimed is:

1. A resistive memory device, comprising:
one or more strings respectively coupled between one or more source lines and one or more bit lines, each string including a set of one or more resistive memory cells;
one or more word lines respectively coupled to the set of one or more resistive memory cells; and
a voltage generator configured to control a level of a turn-on voltage to be applied to one or more unselected word lines among the one or more word lines depending on a program target state of a subset of resistive memory cells including one or more resistive memory cells selected from among the set of one or more resistive memory cells.

2. The resistive memory device according to claim 1, wherein the voltage generator is configured to increase the level of the turn voltage when the program target state rises.

3. The resistive memory device according to claim 2, wherein the turn-on voltage is set to a positive voltage higher than a ground voltage.

4. The resistive memory device according to claim 1, wherein the voltage generator is configured to generate a ground voltage to be applied to the one or more source lines and generate a set voltage to be applied to the one or more bit lines.

5. The resistive memory device according to claim 4, wherein the set voltage is set to a positive voltage higher than the ground voltage.

6. The resistive memory device according to claim 1, wherein the voltage generator is configured to generate a turn-off voltage to be applied to a selected word line coupled to the one or more selected resistive memory cells included in the subset of resistive memory cells.

7. The resistive memory device according to claim 6, wherein the turn-off voltage is set to a ground voltage.

8. The resistive memory device according to claim 1, wherein, when the one or more source lines are respectively coupled to each of the one or more strings, the voltage generator is configured to generate a ground voltage to be applied to the one or more bit lines and to control reset voltages to be applied to the one or more source lines respectively coupled to the one or more strings depending on the program target state.

9. The resistive memory device according to claim 8, wherein the reset voltages are set to negative voltages lower than the ground voltage.

10. The resistive memory device according to claim 8, wherein the voltage generator is configured to decrease the levels of the reset voltages when the program target state rises.

11. A method of operating a resistive memory device during a program operation performed on resistive memory cells coupled between one or more source lines and one or more hit lines, the method comprising:
applying a ground voltage to the one or more source lines and applying a set voltage higher than the ground voltage to one or more bit lines selected from among the one or more bit lines;
applying a turn-off voltage to a selected word line coupled to resistive memory cells selected from among the resistive memory cells; and
applying a turn-on voltage, a level of which is controlled depending on a program target state of the selected resistive memory cells, to unselected word lines coupled to unselected resistive memory cells among the resistive memory cells.

12. The method according to claim 11, wherein the turn-off voltage is set to the ground voltage.

13. The method according to claim 11, wherein the turn-on voltage is set to a positive voltage higher than the turn-off voltage.

14. The method according to claim 11, wherein the level of the turn-on voltage is controlled to be higher as the program target state rises.

15. The method according to claim 11, wherein, when the program operation is performed on the selected resistive memory cells, the turn-off voltage is applied to bit lines coupled to resistive memory cells, the program target state of which is an erased state, or which have been programmed to the program target state.

16. The method according to claim 11, further comprising:
when resistive memory cells, the program target state of which is a first program state, among the selected resistive memory cells, are programmed to the first program state, programming resistive memory cells, the program target state of which is a second program state, among the resistive memory cells programmed to the first program state.

17. The method according to claim 16, wherein programming the resistive memory cells, the program target state of which is the second program state, comprises:
applying the ground voltage to unselected bit lines among the one or more bit lines and to the one or more source lines, and applying the set voltage to remaining bit lines other than the unselected bit lines;
applying a turn-off voltage to the selected word line; and
applying a voltage higher than the turn-on voltage to the unselected word lines.

18. A method of operating a resistive memory device, comprising:
applying a ground voltage to selected bit lines and applying reset voltages to selected source lines;
applying a turn-off voltage to a selected word line; and
applying a turn-on voltage to unselected word lines,
wherein the reset voltages are controlled depending on a program target state of selected memory cells coupled to the selected word line.

19. The method according to claim 18, wherein the level of the reset voltages is set to be higher as the program target state rises.

20. The method according to claim 18, wherein the reset voltages are set to negative voltages lower than the ground voltage.

* * * * *